United States Patent
Matsui et al.

[11] Patent Number: 5,877,719
[45] Date of Patent: Mar. 2, 1999

[54] METHOD OF CONTROLLING ANALOG-TO-DIGITAL CONVERTER

[75] Inventors: Hideo Matsui; Taiki Nishiuchi; Yuji Kitaguchi, all of Tokyo, Japan

[73] Assignees: Mitsubishi Electric Engineering Co., Ltd.; Mitsubishi Denki Kabushiki Kaisha, both of Tokyo, Japan

[21] Appl. No.: 888,621

[22] Filed: Jul. 7, 1997

[30] Foreign Application Priority Data

Feb. 24, 1997 [JP] Japan .................................... 9-039316

[51] Int. Cl.⁶ ...................................................... H03M 1/34
[52] U.S. Cl. ............................................. 341/155; 341/122
[58] Field of Search .................................... 341/110, 154, 341/155, 144, 150, 172, 120, 122

[56] References Cited

U.S. PATENT DOCUMENTS

| | | | |
|---|---|---|---|
| 4,658,198 | 4/1987 | Thurber, Jr. | 320/1 |
| 4,837,572 | 6/1989 | Gulczynski | 341/150 |
| 4,851,838 | 7/1989 | Shier | 341/121 |
| 5,012,247 | 4/1991 | Dillman | 341/172 |
| 5,036,223 | 7/1991 | Sakai et al. | 307/448 |
| 5,165,058 | 11/1992 | Nakatani et al. | 341/158 |
| 5,276,446 | 1/1994 | Sellars | 341/118 |
| 5,307,066 | 4/1994 | Kobayashi et al. | 341/155 |
| 5,402,128 | 3/1995 | Kusumoto et al. | 341/172 |
| 5,736,951 | 4/1998 | Kobatake | 341/159 |

FOREIGN PATENT DOCUMENTS

| | | |
|---|---|---|
| 59-104827 | 6/1984 | Japan . |
| 62-298230 | 12/1987 | Japan . |
| 64-65928 | 3/1989 | Japan . |
| 1321728 | 12/1989 | Japan . |
| 2159814 | 6/1990 | Japan . |
| 4220814 | 8/1992 | Japan . |

*Primary Examiner*—Howard L. Williams
*Assistant Examiner*—Peguy JeanPierre
*Attorney, Agent, or Firm*—Leydig, Voit & Mayer

[57] ABSTRACT

A method of controlling an analog-to-digital (A/D) converter for converting an input voltage into digital data. The conversion process includes charging a capacitor with the input voltage to be converted into a digital data, and disconnecting the input voltage from the capacitor. A reference voltage, generated according to digital data, is furnished by a control circuit to a digital-to-analog (D/A) converting unit. The reference voltage is applied to the capacitor by turning on a switch connected between the D/A converting unit and the capacitor. New digital data to be furnished by the control circuit is determined according to a charged voltage on the capacitor. The D/A converting unit causes the reference voltage to be delivered to the capacitor to change to a new value according to the new digital data from the control circuit. Before the reference voltage begins a transition to a new value, the switch is turned off and kept off until the reference voltage from the D/A converting unit becomes stable at the new value.

13 Claims, 20 Drawing Sheets

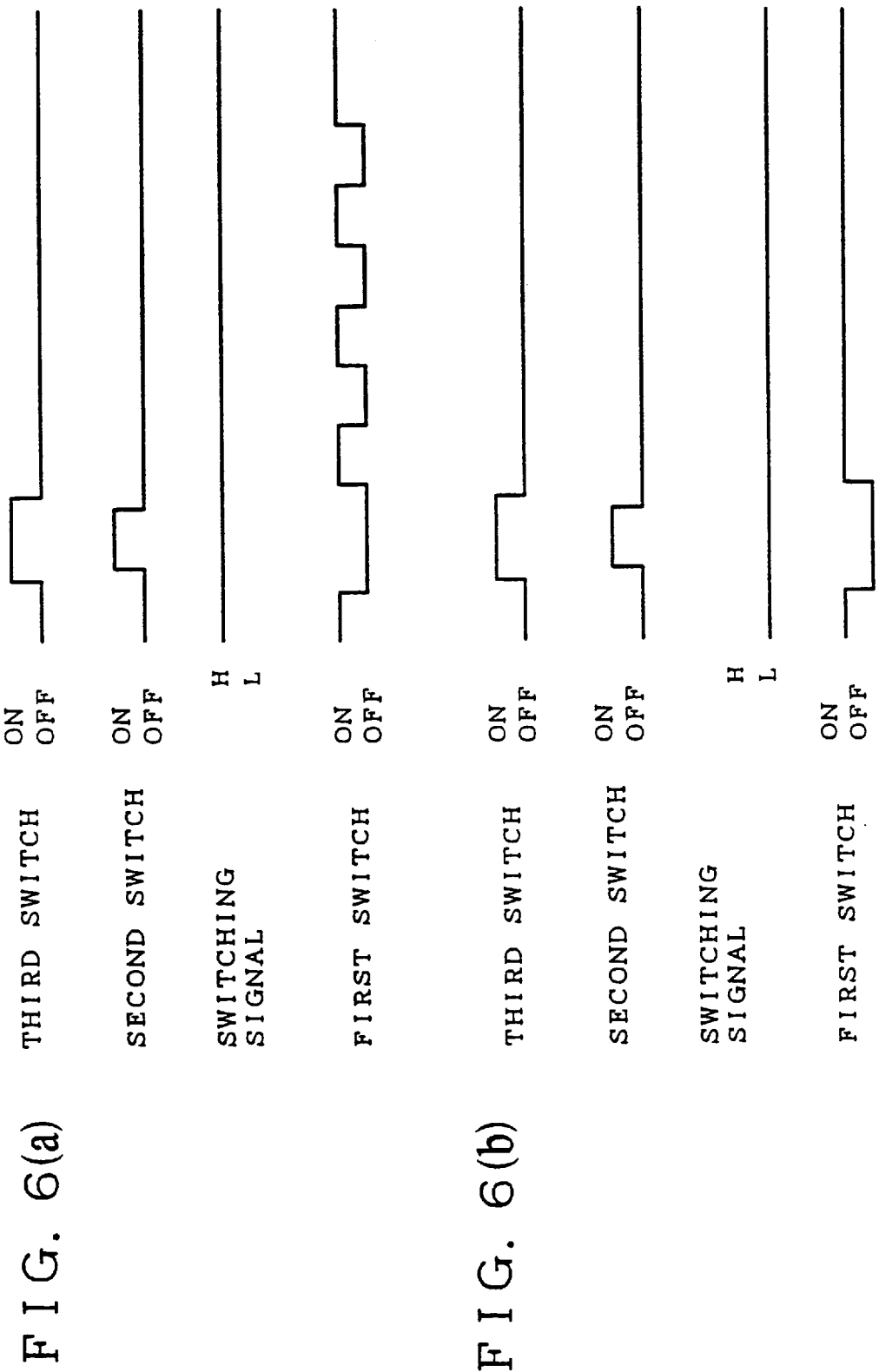

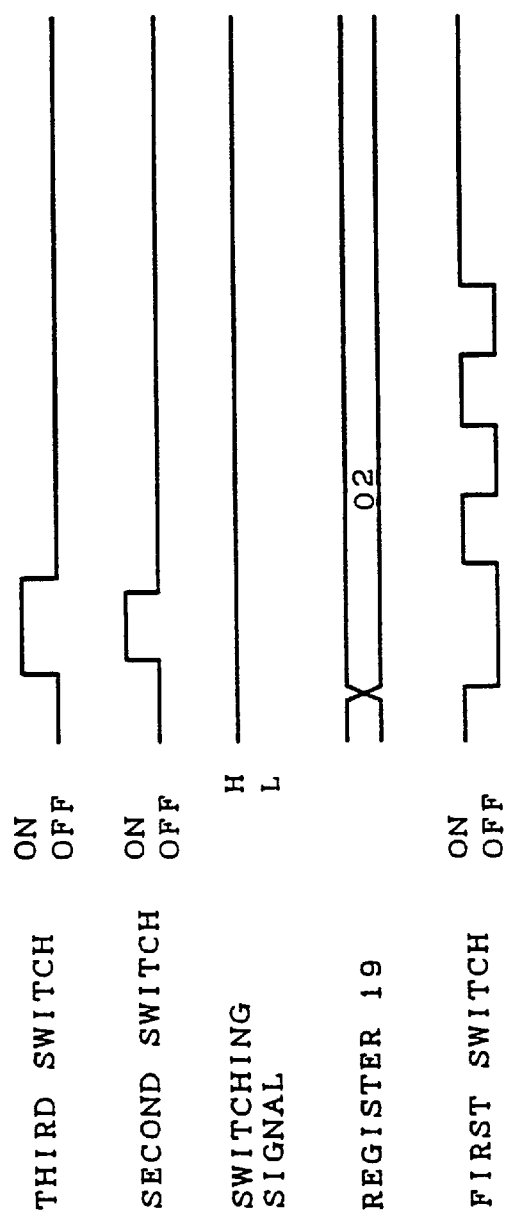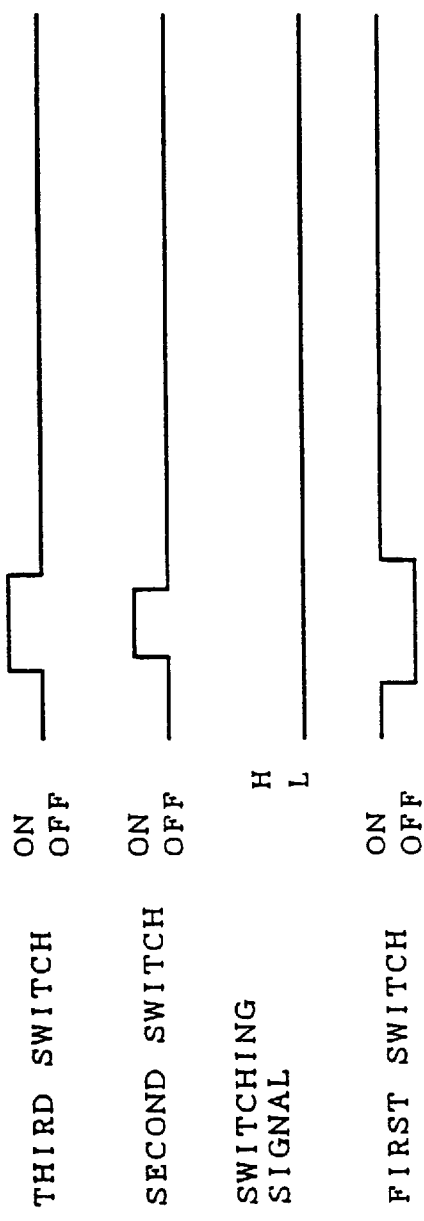

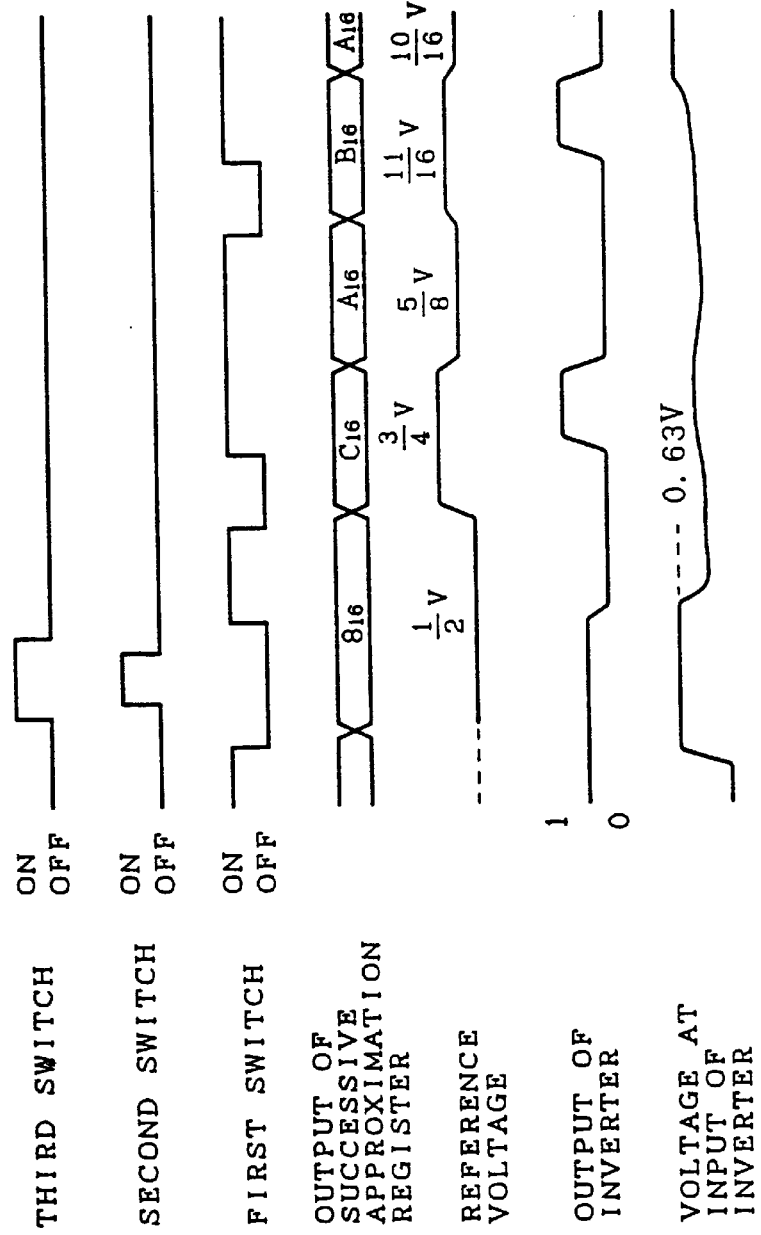
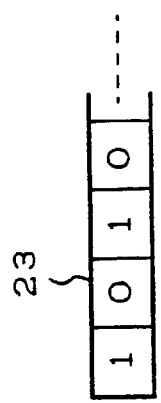

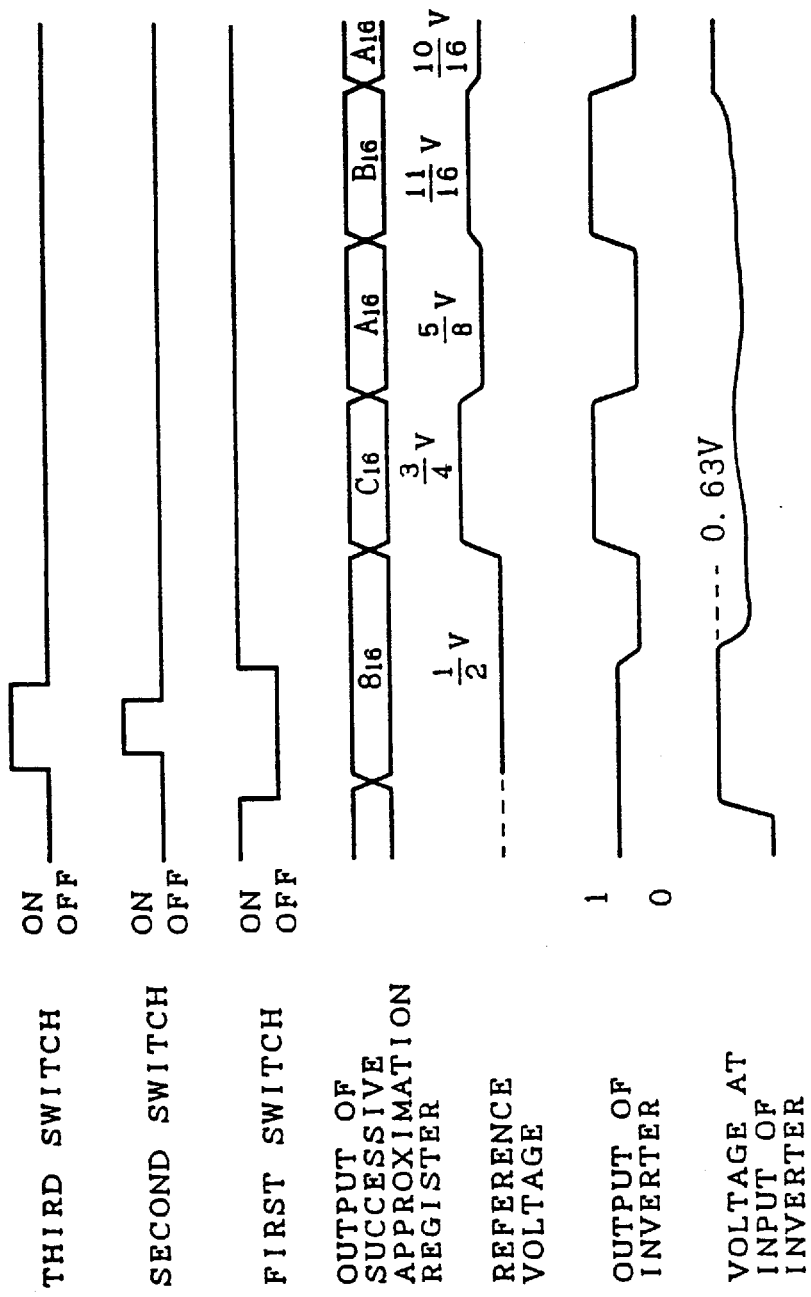

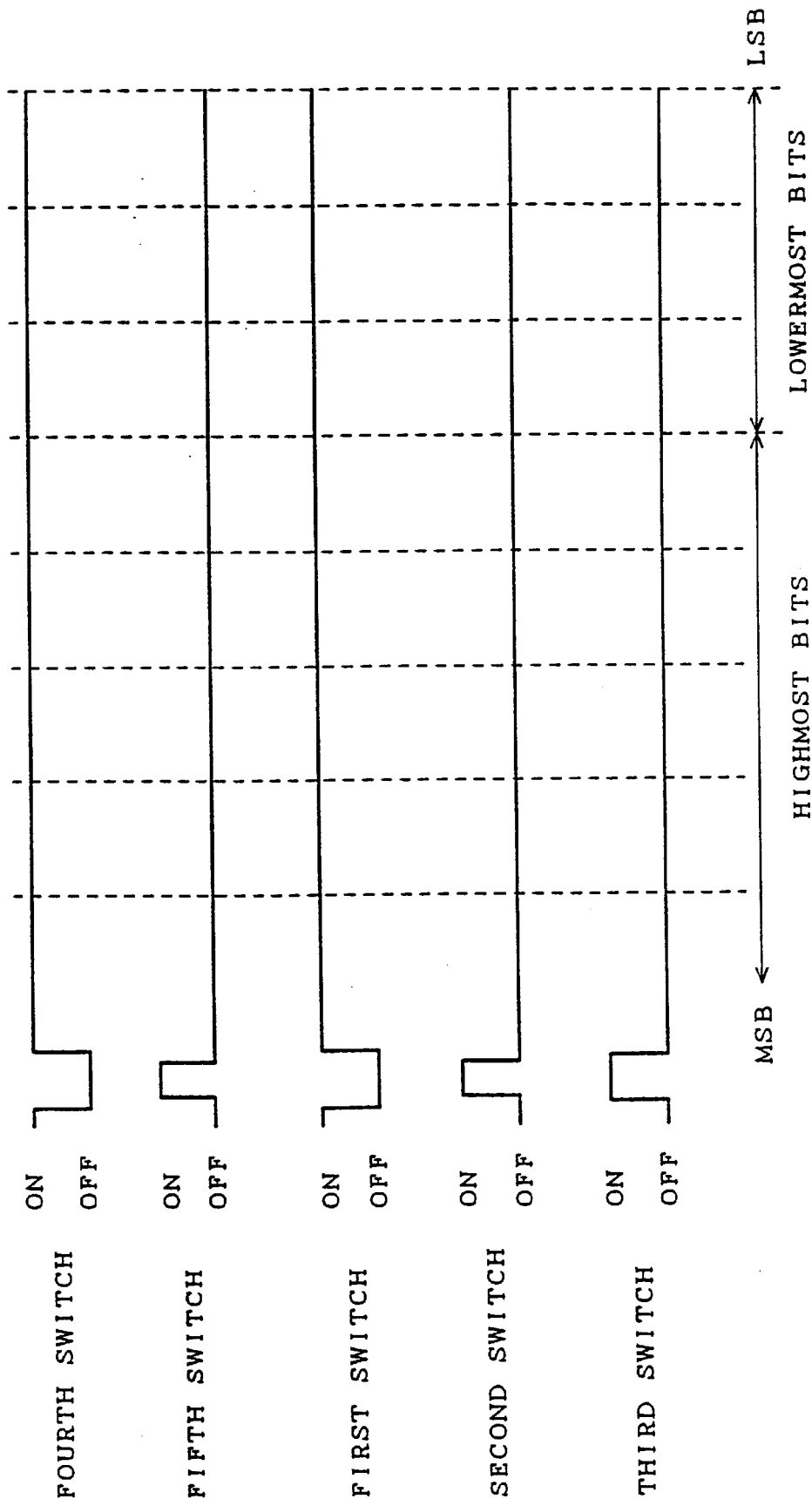

METHOD OF CONTROLLING ANALOG-TO-DIGITAL CONVERTER

BACKGROUND OF THE INVENTION

1. Field of the Invention

The present invention pertains to a method of controlling an analog-to-digital (AD) converter. More particularly, it relates to a method of controlling an AD converter formed on a semiconductor substrate and implemented in a semiconductor integrated circuit.

2. Description of the Prior Art

Referring now to FIG. 18, there is illustrated a block diagram showing the structure of a successive approximation 4-bit AD converter having a sample-and-hold function, to which a prior art AD converter controlling method as disclosed in, for example, Japanese Patent Application Laying Open No. 1-321728, is applicable. In the figure, reference numeral 1 denotes a control circuit, 2 denotes a successive approximation register holding digital data furnished by the control circuit 1, 3 denotes a resistor ladder, 4 and 5 denote power supply terminals for applying a basic voltage V, which is equal to a maximum of voltages which can be converted by the AD converter, across the resistor ladder 3, and 6 denotes a switch group comprised of switches for selecting, as a reference voltage Vref, one from among a plurality of voltages generated by the resistor ladder 3 according to a data furnished by the successive approximation register 2. The resistor ladder 3 and the switch group 6 serve as a digital-to-analog (DA) converter for digital-to-analog converting a digital data furnished by the control circuit 1 into the reference voltage Vref.

Furthermore, reference numeral 7 denotes an input terminal to which an input voltage Vin is applied, 8 denotes a capacitor, and 9 denotes an inverter. The capacitor 8 and the inverter 9 form a chopper comparator for comparing the input voltage Vin to the reference voltage Vref in cooperation with each other. Reference numeral 10 denotes a first switch, 11 denotes a second switch, 12 denotes a third switch, and 13 denotes a timing generator for generating a timing pulse to turn on or off each of the switches 10 to 12, and a timing pulse to trigger the successive approximation register 2 to furnish a data stored therein to the switch group 6.

Referring next to FIG. 20, there is illustrated a timing diagram for explaining the operation of the prior art method of controlling the AD converter shown in FIG. 18. FIG. 20 shows the case where a voltage of 0.63 volts which is 0.63 times the basic voltage V, as the input voltage Vin, is applied to the input terminal 7. The timing generator 13 generates a timing pulse to turn on the first switch 10 first, and, after that, the timing generator 13 further generates a timing pulse to trigger the successive approximation register 2 to furnish data held therein to the switch group 6. A hexadecimal number such as "8h" is delivered to the switch group first by the successive approximation register 2. According to the data, the switch group 6 furnishes the reference voltage Vref of ½ V which is generated by the resistor ladder 3. The resistor ladder 3 divides the basic voltage V into a plurality of voltages Vi (i=1 to n). Thus, the switch group 6 selects, as the reference voltage, one from among the plurality of voltages Vi generated by the resistor ladder 3 according to the digital data from the successive approximation register 2.

Then the timing generator 13 generates a timing pulse to turn on the third switch 12 so as to raise a condition in which the capacitor 8 can become charged. Furthermore, the timing generator 13 generates a timing pulse to turn on the second switch 11 so as to charge the capacitor 8 with the input voltage Vin applied to the input terminal 7. When the capacitor 8 becomes charged, the second and third switches 11 and 12 are turned off sequentially, and the first switch 10 is further turned on. When the first switch 10 is switched on, the reference voltage Vref furnished by the switch group 6 is applied to the capacitor 8 and is compared with the input voltage Vin. In this case, since the input voltage Vin is 0.63 V and the reference voltage is ½ V, the inverter 9 outputs a signal having a value of zero.

When the control circuit 1 receives the signal at a logical state 0 from the inverter 9, it changes the digital data delivered to the successive approximation register to a hexadecimal number "Ch". The new digital data is furnished to the switch group 6 by way of the successive approximation register 2. Then the switch group 6 selects and furnishes the new reference voltage Vref of (¾) V according to the digital data applied thereto. As shown in FIG. 20, since the first switch 10 had been already turned on and the second and third switches 11 and 12 had been already turned off when the capacitor 8 became charged with the reference voltage at the first time, it is not necessary to repeat the turning-on/off operation on the first, second, and third switches 10 to 12 after the first reference voltage Vref has been applied to the capacitor. Thus, the first switch 10 remains in the on state and the second and third switches 11 and 12 remain in the off state, and therefore the selected reference voltage Vref of ¾ V is applied to the capacitor 8 by way of the first switch 10 and is compared with the input voltage of 0.63 V. As a result, the inverter 9 outputs a signal at a logical state 1. After that, the AD converter repeats a similar control operation, and, finally, furnishes a hexadecimal number "Ah" as a conversion result.

When the control circuit 1 determines a new digital data to be furnished to the switch group 6 by way of the successive approximation register 2, one switch of the switch group 6 changes from the on state to the off state and another switch of the switch group 6 changes from the off state to the on state. This switching operation causes the reference voltage Vref furnished by the switch group 6 to make a transition to a new value under the control of the switch group 6, as shown in FIG. 20. That is, the reference voltage Vref remains in an unstable state during the transition. Thus, when obtaining a second or later bit of the digital data, since the output of the successive approximation register 2 changes while the first switch 10 is held in the on state and the second and third switches 11 and 12 are held in the off state, there is a possibility that a comparison between the input voltage Vin and the reference voltage Vref which remains in an unstable state is performed. Such a change in the reference voltage Vref which is making a transition to a new value, which has been caused by the tap changing of the resistor ladder 3, under the control of the switch group exerts a bad influence upon the conversion accuracy of the AD converter.

A capacitance-coupled AD converter has been controlled by using a controlling method similar to the aforementioned prior art AD converter controlling method for use in a successive approximation AD converter having a sample-and-hold function. Next, the description will be directed to the prior art method of controlling a capacitance-coupled AD converter.

Referring next to FIG. 19, there is illustrated a block diagram showing the structure of an 8-bit capacitance-coupled AD converter to which the prior art AD converter controlling method is applicable. In the figure, the same components as the AD converter shown in FIG. 18 are designated by the same reference numerals, and therefore the description about the components will be omitted hereinafter. In FIG. 19, reference numeral 14 denotes a second capacitor, 15 denotes a base terminal to which a basic potential such as an analog basic potential AVSS is applied, and 16 denotes a switch group comprised of a plurality of switches, which is different from the switch group 6 shown in FIG. 18 in that the switch group 16 can furnish a first reference voltage Vref used for a comparison to be performed for obtaining the five uppermost bits of a conversion result and a second reference voltage Vref used for a comparison to be performed for obtaining the three lowermost bits of the conversion result, separately. Furthermore, reference numeral 17 denotes a fourth switch, and 18 denotes a fifth switch. A semiconductor switch such as a field-effect transistor analog switch can be used as each of the switches, which can be turned on or off in response to a timing pulse generated by the timing generator 13.

Referring next to FIG. 21, there is illustrated a timing diagram for explaining the operation of the prior art method of controlling the capacitance-coupled AD converter shown in FIG. 19. Such the capacitance-coupled AD converter has been developed as a technique for improving the conversion accuracy when it is used in the case where the number of bits of a digital data to be obtained is relatively large. The 8-bit capacitance-coupled AD converter shown in FIG. 19 can separately perform AD conversions for the five uppermost bits and three lowermost bits of the conversion result. When charging the first capacitor 8 and the second capacitor 14, the first switch 10, second switch 11, third switch 12, fourth switch 17, and fifth switch 18 are sequentially turned on and off with timing as will be mentioned below. After that, these switches do not repeat the turning on/off operation. To be more specific, when converting the input voltage Vin into digital data, the first and fourth switches 10 and 17 are turned off first. Then the third, second, and fifth switches 12, 11, and 18 are turned on. As a result, the first and second capacitors 8 and 14 become charged. When the charging is completed, the second, third, and fifth switches 11, 12, and 18 are turned off and, after that, the first and fourth switches 10 and 17 are turned on. Then an AD conversion is started.

When comparisons for obtaining the uppermost bits of the conversion result are started, the reference voltage Vref furnished by the switch group 16 is applied to the first capacitor 8 by way of the first switch 10 which remains in the on state. Furthermore, during the comparison carried out to obtain each of the uppermost bits of the conversion result, the switch group 16 constantly supplies a constant voltage of 0 V to the second capacitor 14 by way of the fourth switch 17 which remains in the on state. The inverter 9 compares the reference voltage Vref with the sum of the charged voltages across the first and second capacitors 8 and 14, and then furnishes its output having a value which depends on the comparison result to the control circuit 1. The control circuit 1 determines new digital data to be delivered to the successive approximation register according to the value of the output of the inverter. The reference voltage Vref to be furnished to the first switch 10 by the switch group 16 is thus changed according to the new digital data from the successive approximation register. At that time, since the first switch 10 is held in the on state, the reference voltage Vref is applied to the first capacitor 8 and therefore the inverter 9 furnishes its output having a value which depends on the comparison between the reference voltage Vref and the sum of the charged voltages across the capacitors 8 and 14 to the control circuit 1. After that, a further AD conversion operation is similarly carried out to obtain the remainder of the five uppermost bits of the conversion result.

When the comparisons for obtaining the five uppermost bits are completed, the AD converter shifts to comparisons for obtaining the three lowermost bits of the conversion result. After the comparisons for the lowermost bits are started, the reference voltage Vref furnished by the switch group 16 is applied to the second capacitor 14 by way of the fourth switch 17 which remains in the off state. During the comparison for obtaining each of the lowermost bits, a voltage having a value which corresponds to binary data comprised of the five uppermost bits fixed as mentioned above and the three lowermost bits each set to 0, which will be referred to as a final value, is constantly applied to the first capacitor 8 by way of the first switch 10 which remains in the on state. The inverter 9 compares the sum of the voltage having the final value and the reference voltage Vref with the sum of the charged voltages across the first and second capacitors 8 and 14. Then the inverter furnishes its output having a value which depends on the comparison result to the control circuit 1. The control circuit 1 determines new digital data to be delivered to the successive approximation register according to the value of the output of the inverter. The reference voltage Vref to be furnished to the fourth switch 17 by the switch group 16 is thus changed according to the new digital data from the successive approximation register. At that time, since the fourth switch 17 is held in the on state, the reference voltage Vref is applied to the second capacitor 14 and therefore the inverter 9 furnishes its output having a value which depends on the comparison between the sum of the voltage having the final value and the reference voltage Vref and the sum of the charged voltages across the capacitors 8 and 14 to the control circuit 1. After that, a further AD conversion operation is similarly carried out to obtain the remainder of the three lowermost bits of the conversion result.

The reference voltage Vref which is generated by the resistor ladder 3 and is selected by the switch group 6 is thus injected to the inverter 9 during the comparison for the uppermost and lowermost bits. Therefore, in either case, since the first and fourth switches 10 and 17 remain in the on state, the unstable reference voltage Vref which is making a transition from the previous value to a new value under the control of the switch group 16, is applied, by way of either the first switch 10 or the fourth switch 17, to the first capacitor 8 or the second capacitor 14 and hence to the input of the inverter 9. Thus, the unstable reference voltage Vref which is changing to a new value under the control of the switch group 16 exerts a bad influence upon the conversion accuracy of the AD converter.

Thus, a problem with the prior art method of controlling an AD converter which is so implemented as mentioned above is that in the case where the method is used for a successive approximation AD converter having a sample-and-hold function, since the AD converter controls the switch group 16 which selects, as the reference voltage Vref, one from among a plurality of voltages into which the voltage V between the terminals 4 and 5 is divided by the resistor ladder 3, with the first switch 10 held in the closed state, the conversion accuracy of the AD converter is decreased due to the unstable reference voltage furnished by the switch group 16 which is making a transition to a new value under the control of the switch group. As previously explained, when starting an AD conversion, the first to third switches 10 to 12 operate sequentially with predetermined timing so that the capacitor 8 is charged with the input voltage Vin. Then, the AD converter turns off the second and third switches 11 and 12 sequentially, and further turns on the first switch 10. After that, the AD converter does not repeat such the turning on/off operation. The unrepeatable switching operation has made it difficult to fix the above problem.

Similarly, in the case of controlling a capacitance-coupled AD converter, the prior method suffers from the same drawback that since both the first and fourth switches 10 and 17 are held in the closed state when conducting comparisons for the uppermost and lowermost bits, the conversion accuracy of the AD converter is decreased due to the unstable reference voltage Vref furnished by the switch group 16 which is changing to a new value under the control of the switch group 16.

SUMMARY OF THE INVENTION

The present invention is made to overcome the problem. It is therefore an object of the present invention to provide an AD converter controlling method which can improve its conversion accuracy by independently controlling one or more switches for respectively connecting a switch group for selecting and supplying a reference voltage to one or more capacitors in such a manner that an unstable reference voltage furnished by the switch group which remains in a transient state under the control of the switch group does not exert a bad influence upon the AD conversion operation of the AD converter.

In accordance with the present invention, there is provided a method of controlling an analog-to-digital (AD) converter which converts an input voltage into digital data. The method includes charging a capacitor with the input voltage to be converted into a digital data. The input voltage is then disconnected from the capacitor. A reference voltage is furnished by a digital-to-analog (DA) converting unit to the capacitor. Furnishing the reference voltage includes turning on a switch connected between the DA converting unit and the capacitor. New digital data to be furnished by the control circuit is determined according to a relationship between the voltages applied to the capacitor. The DA converting unit causes the reference voltage to be delivered to the capacitor to change to a new value according to the new digital data from the control circuit. Before the reference voltage begins a transition to a new value, the switch is turned off and maintained in an off state until the reference voltage from the DA converting unit becomes stable at the new value.

In accordance with a preferred embodiment of the present invention, the switch is turned off every time the reference voltage from the DA converting unit makes a transition to a new value. The switch is maintained in the off state until the reference voltage becomes stable.

In accordance with another preferred embodiment of the present invention, the switch is turned off only if the reference voltage from the DA converting unit makes a predetermined transition to a new value. The switch is held in the off state until the reference voltage becomes stable.

In another preferred embodiment, the switch is turned off only if the amount of change in the reference voltage which makes a transition to a new value is greater than or equal to a predetermined value. The switch is held in the off state until the reference voltage becomes stable.

Alternatively, the method may include presetting a number of times that the switch is turned off and is then held in its off state during a transition in the reference voltage. If a number of times that the reference voltage has made a transition to a new value does not exceed the preset number of times that the switch is turned off and is then held in its off state, until the reference voltage becomes stable.

In accordance with another preferred embodiment of the present invention, the method includes determining whether or not to hold the switch in its off state during each transition in the reference voltage. The switch is turned off only if the reference voltage makes a predetermined transition to a new value determined in advance.

In accordance with another preferred embodiment of the present invention, the method includes providing a plurality of operational modes for defining operations of the switch. One operational mode is selected from among the plurality of operational modes. Whether or not the switch will be turned off before the reference voltage starts to make a transition to a new value and then held in the off state until the reference voltage becomes stable is determined according to one operational mode selected.

In accordance with another preferred embodiment of the present invention, a first operational mode is provided in which the switch is turned off every time the reference voltage from the DA converting unit makes a transition to a new value. A second operational mode is provided in which after the capacitor has become charged with the input voltage and the input voltage is disconnected from the capacitor, the switch is held in its on state even though the reference voltage makes a transition to a new value.

In accordance with another preferred embodiment of the present invention, a first operational mode is provided in which the switch is turned off only if the amount of change in the reference voltage is greater than or equal to a predetermined value. A second operational mode is provided in which after the capacitor has become charged with the input voltage and then the input voltage is disconnected from the capacitor, the switch is held in its on state even though the reference voltage changes to a new value.

In accordance with another preferred embodiment of the present invention, a first operational mode is provided in which the switch is turned off unless a number of times that the reference voltage has made a transition to a new value exceeds a predetermined number of times. A second operational mode is provided in which, after the capacitor has become charged with the input voltage and the input voltage is disconnected from the capacitor, the switch is held in the on state even though the reference voltage changes to a new value.

In accordance with another preferred embodiment of the present invention, a first operational mode is provided in which the switch is turned off every time the reference voltage from the DA converting unit changes to a new value. A second operational mode is provided in which the switch is turned off only if the amount of change in the reference voltage is greater than or equal to a predetermined value. A third operational mode is provided in which, after the capacitor has become charged with the input voltage and the input voltage is disconnected from the capacitor, the switch is held in the on state, even though the reference voltage changes to a new value.

In accordance with another preferred embodiment of the present invention, a first operational mode is provided in which the switch is turned off every time the reference voltage from the DA converting unit makes a transition to a new value. A second operational mode is provided in which the switch is turned off only if the amount of change in the reference voltage is greater than or equal to a predetermined value. A third operational mode is provided in which the switch is turned off unless a number of times that the reference voltage has made a transition to a new value exceeds a predetermined number of times. A fourth operational mode is provided in which, after the capacitor has become charged with the input voltage and then the input voltage is disconnected from the capacitor, the switch is held in the on state, even though the reference voltage makes a transition to a new value.

In accordance with the present invention, there is provided a method of controlling an analog-to-digital converter which converts an input voltage into a digital data. The method includes charging a first capacitor with the input voltage to be converted into a digital data. A second capacitor is charged with a basic voltage. The input voltage is disconnected from the first capacitor. The basic voltage is disconnected from the second capacitor. In order to obtain uppermost bits of the digital data, a reference voltage to be compared to the input voltage is applied to the first capacitor. Applying the reference voltage includes turning on a switch connected between the DA converting unit and the first capacitor. A constant voltage is furnished by the DA converting unit to the second capacitor. Furnishing the constant voltage includes turning on another switch connected between the DA converting unit and the second capacitor. New digital data to be furnished by the control circuit is determined according to a relationship between voltages applied to the first and second capacitors. The DA converting unit causes the reference voltage to be delivered to the first capacitor to make a transition to a new value according to the new digital data from the control circuit. Before the reference voltage starts to change to a new value, the first switch is turned off and held in the off state until the reference voltage from the DA converting unit becomes stable. In order to obtain the remaining lowermost bits of the digital data, a constant voltage is generated by the DA converting unit. The constant voltage has a value which is the same as binary data of the uppermost bits, and the lowermost bits are 0s. The constant voltage is applied to the first capacitor, by turning on the switch. A second reference voltage generated by the DA converting unit from a digital data from the control circuit is applied to the second capacitor, by turning on the other switch. New digital data to be furnished by the control circuit is determined according to voltages the first and second capacitors. The DA converting unit causes the second reference voltage to be delivered to the second capacitor change to a new value according to the new digital data from the control circuit. Before the second reference voltage makes a transition to a new value, the second switch is turned off and held in the off state until the second reference voltage from the DA converting unit becomes stable.

Further objects and advantages of the present invention will be apparent from the following description of the preferred embodiments of the invention as illustrated in the accompanying drawings.

BRIEF DESCRIPTION OF THE DRAWINGS

FIGS. 6a and 6b are timing diagrams for explaining the operation of the AD converter controlling method according to the fourth embodiment of the present invention;

FIGS. 9a and 9b are timing diagrams for explaining the operation of the AD converter controlling method according to the sixth embodiment of the present invention;

FIG. 15 is a timing diagram for explaining the operation of the AD converter controlling method according to the ninth embodiment of the present invention;

FIG. 16 is a view showing an example of the contents of a control register according to the ninth embodiment of the present invention;

FIG. 20 is a timing diagram for explaining the operation of the successive approximation typed AD converter to which the prior art AD converter controlling method is applicable; and FIG. 21 is a timing diagram for explaining the operation of the capacitance-coupled AD converter to which the prior art AD converter controlling method is applicable.

DETAILED DESCRIPTION OF THE PREFERRED EMBODIMENTS

First Embodiment

Figure 18:
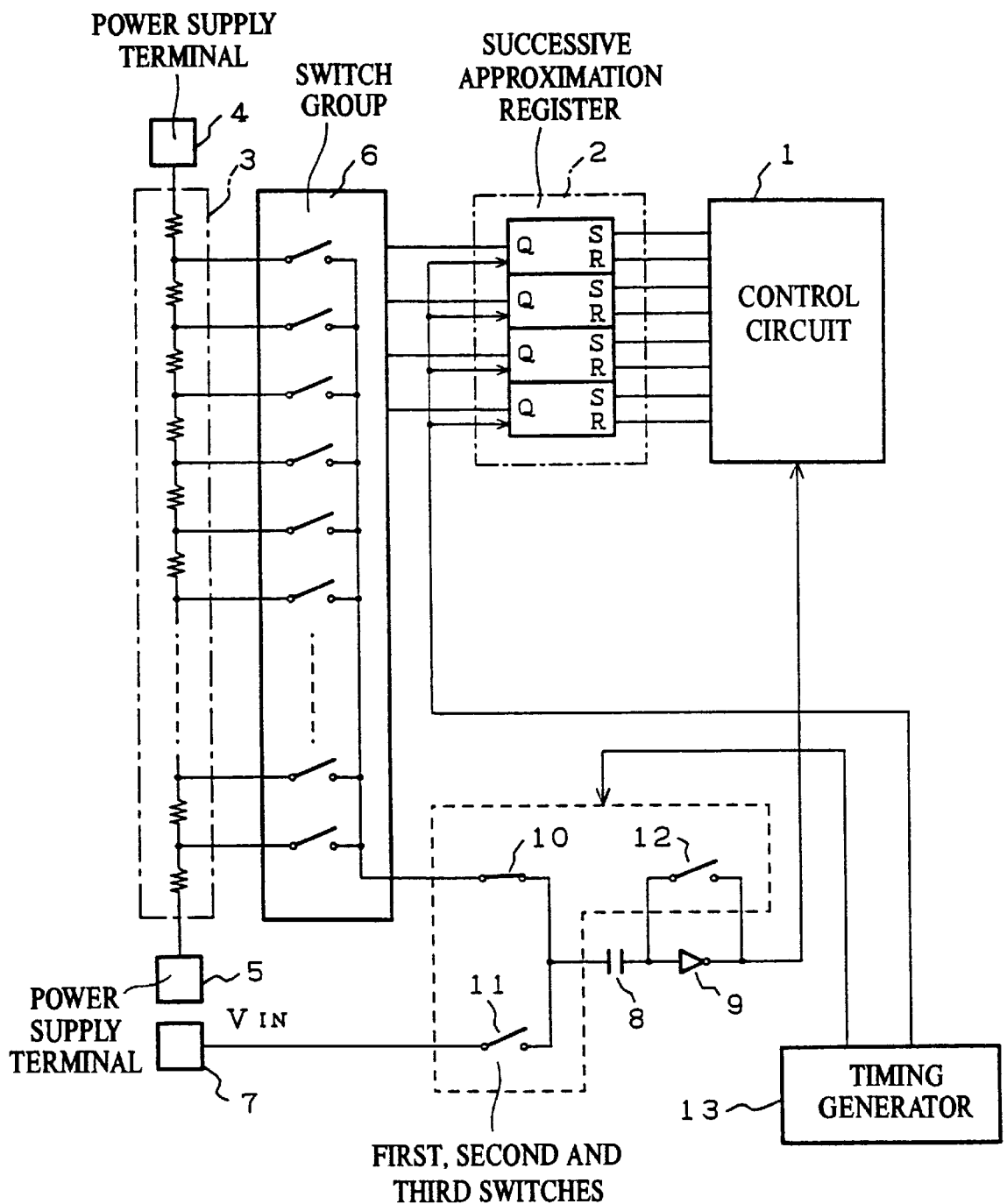
FIG. 18 is a block diagram showing the structure of a successive approximation typed AD converter having a sample-and-hold function to which the AD converter controlling methods according to the first and second embodiments of the present invention and a prior art AD converter controlling method are applicable.

An AD converter controlling method according to the present invention can be applied to a successive approximation AD converter having a sample-and-hold function as shown in FIG. 18. As previously explained, in FIG. 18, reference numeral 1 denotes a control circuit for furnishing digital data having a value which depends on the value of an input signal applied thereto, 2 denotes a 4-bit successive approximation register which can be set or reset with digital data furnished by the control circuit 1, 3 denotes a resistor ladder comprised of a plurality of resistor elements (e.g., sixteen resistor elements) connected in series with each other and having identical resistance values, 4 and 5 denote power supply terminals through which a voltage V, which is equal to the maximum of a plurality of voltages which can be converted by the AD converter, is applied across the resistor ladder 3, and 6 denotes a switch group comprised of a plurality of switches (e.g., fifteen switches) each connected to a point of connection between two adjacent resistor elements of the ladder resistor 3, for selecting one from among a plurality of voltages into which the voltage V across the ladder resister 3 is divided by the plural resistor elements of the ladder resister 3 according to a data from the successive approximation register 2, and for furnishing the selected one as the reference voltage Vref. The ladder resistor 3 and the switch group 6 serve as a digital-to-analog (DA) converter for digital-to-analog converting digital data furnished by the control circuit 1 into the reference voltage Vref so as to output the reference voltage Vref.

Furthermore, reference numeral 7 denotes an input terminal to which an input voltage Vin to be converted into a digital data (or a conversion result) by the AD converter is applied, 8 denotes a capacitor which forms a chopper comparator for comparing the reference voltage Vref furnished by the switch group 6 to the input voltage Vin injected into the AD converter via the input terminal 7, and 9 denotes an inverter having an input connected to one end of the capacitor 8. The inverter 9 forms the chopper comparator in cooperation with the capacitor 8. Reference numeral 10 denotes a first switch which is closed to apply the reference voltage Vref furnished by the switch group 6 to the other end of the capacitor 8, 11 denotes a second switch which is closed to apply the input voltage Vin injected into the AD converter via the input terminal 7 to the other end of the capacitor 8, and 12 denotes a third switch which is closed to short-circuit the input and output of the inverter 9 so that a condition in which the capacitor 8 can become charged is raised. A semiconductor switch such as a field-effect transistor analog switch can be used as each of the switches 10 to 12. Furthermore, reference numeral 13 denotes a timing generator for generating a timing pulse to turn on or off each of the first to third switches 10 to 12, and for generating a timing pulse to trigger the successive approximation register 2 to furnish a data stored therein to the switch group 6.

Figure 1:
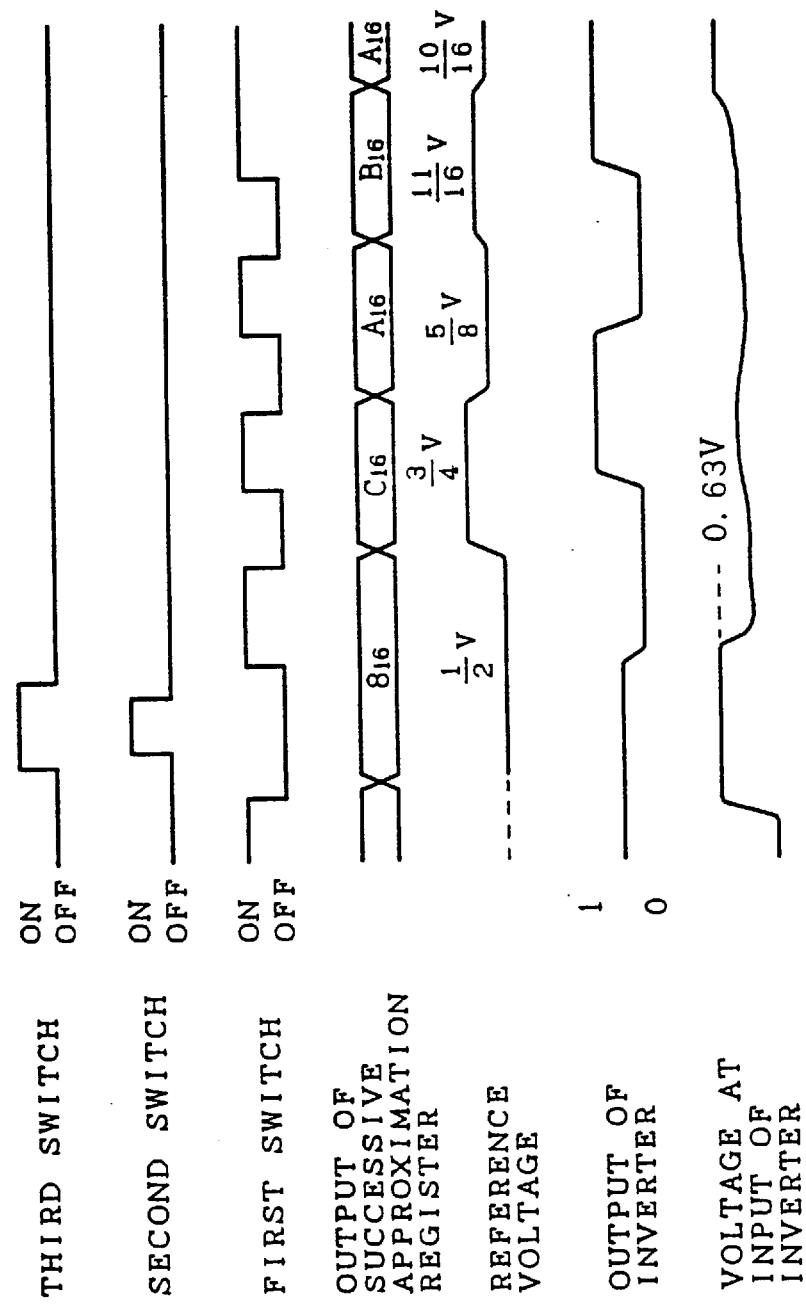
FIG. 1 is a timing diagram for explaining the operation of an AD converter controlling method according to a first embodiment of the present invention.

Referring next to FIG. 1, there is illustrated a timing diagram for explaining the operation of the AD converter shown in FIG. 18 to which the AD converter controlling method of the first embodiment of the present invention is applicable. FIG. 1 shows the case where a voltage of 0.63 V which is 0.63 times the basic voltage V, as the input voltage Vin, is applied to the input terminal 7 and then the input voltage of 0.63 V is converted into a digital data. In this embodiment, when charging the capacitor 8, the first switch 10 is adapted to operate independently of the second and third switches 11 and 12 even after the first to third switches 10 to 12 have operated sequentially with predetermined timing.

Like the prior art AD converter controlling method, in advance of starting an AD conversion operation, the timing generator 13 generates a timing pulse to turn on the first switch 10, and, after that, it also generates and furnishes a timing pulse to the successive approximation register 2 to trigger the successive approximation register 2 to furnish a data held therein to the switch group 6. When obtaining the first bit of the conversion result, the control circuit 1 furnishes a hexadecimal number such as "8h" to the successive approximation register 2 first. The basic voltage V across the resistor ladder 3 is divided into sixteen identical voltages each across each of the sixteen resister elements. According to the digital data "8h" from the successive approximation register 2, the switch group 6 turns on the eighth switch among the fifteen switches and then selects one voltage of ½ V from among the plurality of voltages into which the basic voltage V is divided by the resistor ladder 3 as the reference voltage Vref.

Then the timing generator 13 generates a timing pulse to turn on the third switch 12, and, after that, further generates a timing pulse to turn on the second switch 11. When the third switch 12 is turned on, the input and output of the inverter 9 are short-circuited so that they have identical potentials $V_0$ which are determined by the input/output characteristic of the inverter 9. The potential $V_0$ is thus applied to one end of the capacitor 8. After that, when the second switch 11 is turned on, the input voltage Vin injected to the input terminal 7 is applied to the other end of the capacitor 8 so as to charge the capacitor 8 to the difference between the input voltage Vin and the potential $V_0$. When the capacitor 8 becomes charged, the timing generator 13 generates a timing pulse to turn off the second and third switches 11 and 12 sequentially.

After that, the timing generator 13 further generates a timing pulse to turn on the first switch 10, so that the reference voltage Vref furnished by the switch group 6 is applied to the capacitor 8 by way of the first switch 10. As a result, the reference voltage Vref is compared with the input voltage Vin. In this case, since the reference voltage is ½ V and the input voltage Vin is 0.63 V, and hence Vin>Vref, the inverter 9 outputs a signal having a value of zero. When the control circuit 1 receives the signal at a logical state 0 from the inverter 9, it changes the digital data to be delivered to the successive approximation register from the previous hexadecimal number "8h" to a hexadecimal number "Ch". The new digital data is written into the successive approximation register 2.

Then the timing generator 13 generates a timing pulse to turn off the first switch 10, and, after that, further generates a timing pulse to trigger the successive approximation register 2 to furnish the new digital data held therein to the switch group 6. According to the digital data furnished by the successive approximation register 2, the switch group 6 selects and furnishes one voltage of (¾) V which corresponds to the value "Ch" of the digital data as the reference voltage Vref. At that time, while the second and third switches 11 and 12 are held in the off state, the first switch 10 has been switched from the on state to the off state, as mentioned above. Accordingly, there is no possibility that the reference voltage Vref which is making a transition from ½ V to ¾ V is applied to the capacitor 8 by way of the first switch 10.

At least from the time the reference voltage Vref starts to make a transition from ½ V to ¾ V until the time it becomes stable, the first switch 10 is held in the off state. After the reference voltage Vref becomes stable, the timing generator 13 generates a timing pulse to turn on the first switch 10. Actually, the value of the reference voltage Vref cannot be perfectly stabilized. In addition, the time required for the reference voltage to become stable is not constant due to variations in the characteristics of the switch group. Throughout this specification, the time period required for the reference voltage to become stable is referred to as a time which elapses until the reference voltage Vref which has started to make a transition to a new value becomes stable to such an extent that the inverter 9 does not follow any change in the reference voltage Vref regardless of its response characteristic. While the method of the present invention is characterized in that the first switch 10 is forcedly switched to the off state during any transition in the reference voltage Vref, it should be understood that the method of the present invention does not define the length of a period of time during which the first switch 10 is held in the off state during a transition in the reference voltage Vref.

When the reference voltage Vref furnished by the switch group 6 has been stabilized at ¾ V and then the first switch 10 is turned on in response to a timing pulse generated by the timing generator 13, the reference voltage Vref is applied to the capacitor 8 by way of the first switch 10. At that time, since the capacitor 8 is held in the state wherein it is charged with the input voltage Vin, a comparison between the input voltage Vin and the new reference voltage Vref is carried out. In this case, the new reference voltage Vref is ¾ V and the input voltage Vin of 0.63 V. Thus, since Vin<Vref, the inverter 9 outputs a signal at a logical state 1.

After that, the AD converter repeats the same control operation for a further comparison between the reference voltage having a value of ⅝ V or another value furnished by the switch group 6 and the input voltage Vin, and, finally, the successive approximation register 2 of the AD converter furnishes a hexadecimal number "Ah" as the AD conversion result which corresponds to the value, i.e., 0.63 V of the input voltage Vin at the time just before the second switch 11 switches to the off state.

As previously explained, the AD conversion controlling method according to the first embodiment of the present invention has the step of turning off and holding the first switch 10 in the off state in order to prevent the reference voltage Vref from being applied to the capacitor 8 while the reference voltage Vref furnished by the switch group 6 is making a transition, which is caused by the tap changing of the resistor ladder 3 performed by the switch group 6 when the control circuit 1 changes the digital data to be delivered to the switch group 6 by way of the successive approximation register 2. Accordingly, during any transition in the reference voltage Vref, a comparison between the input voltage Vin and the reference voltage Vref which has not become stable cannot be carried out. Thus, the embodiment of the present invention can offer an advantage of providing an AD converter controlling method which is immune to the unstable reference voltage furnished by the switch group 6, which is making a transition from its previous value to its new value, which is caused by the tap changing of the resistor ladder 3, under the control of the switch group 6.

Second Embodiment

Figure 2:
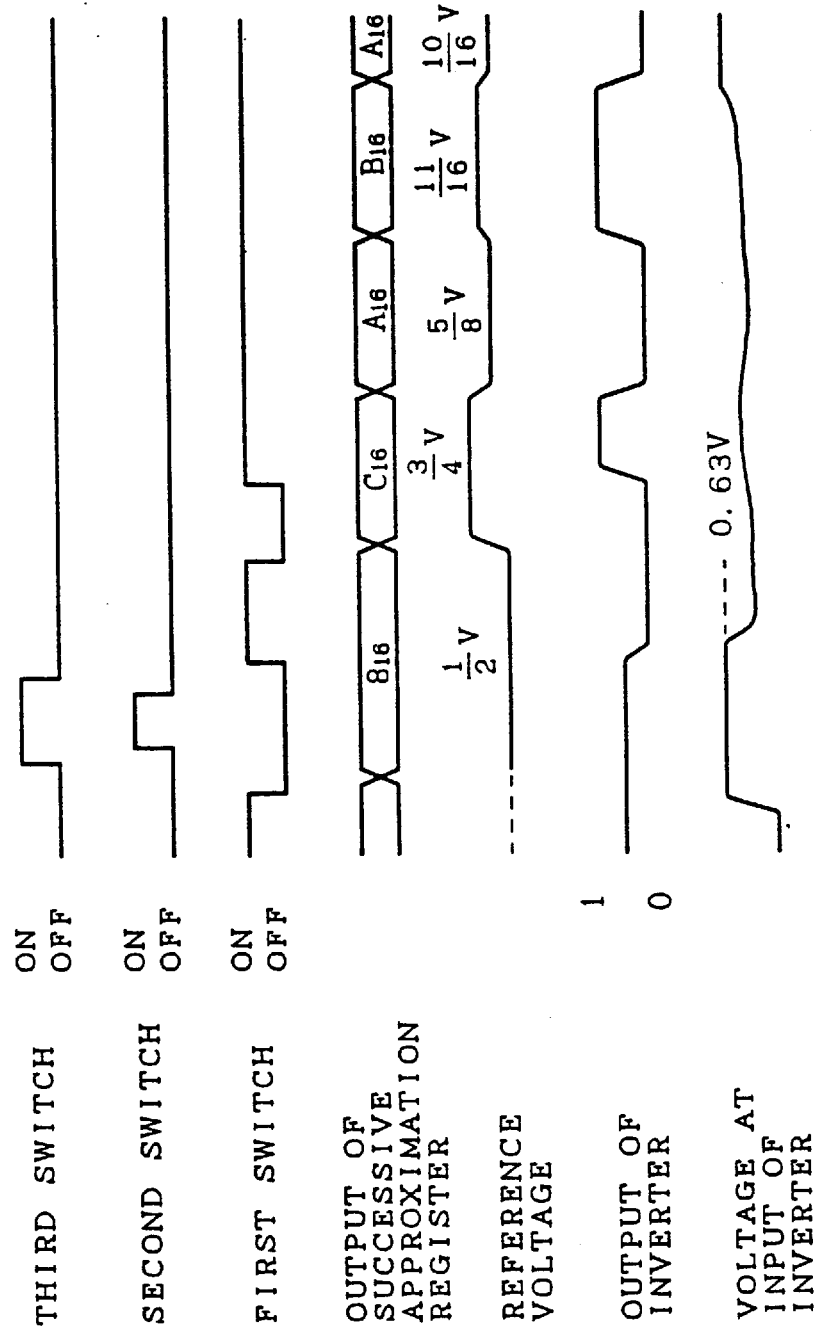
FIG. 2 is a timing diagram for explaining the operation of an AD converter controlling method according to a second embodiment of the present invention.

An AD converter controlling method according to the second embodiment of the present invention has the step of turning off the first switch 10 before the reference voltage Vref starts to make a transition to a new value, only if the amount of change in the threshold voltage is greater than or equal to a predetermined value, and then holding the first switch 10 in the off state during a transition in the threshold voltage Vref. Referring next to FIG. 2, there is illustrated a timing diagram for explaining the operation of the AD converter shown in FIG. 18 to which the AD converter controlling method according to the second embodiment of the present invention is applicable. The structure of the AD converter is the same as that of the AD converter of the first embodiment shown in FIG. 18, and therefore the description about the structure of the AD converter will be omitted hereinafter.

Like the first embodiment of the present invention, in advance of starting an AD conversion operation, the timing generator 13 generates a timing pulse to turn off the first switch 10, and, after that, it also generates and furnishes a timing pulse to the successive approximation register 2 to trigger the successive approximation register 2 to furnish a data held therein to the switch group 6. When obtaining the first bit of the conversion result, the control circuit 1 furnishes a hexadecimal number such as "8h" to the successive approximation register 2 first. The basic voltage V across the ladder resistor 3 is divided into sixteen identical voltages each across each of the sixteen resister elements. According to the digital data "8h" from the successive approximation register 2, the switch group 6 turns on the eighth switch among the fifteen switches and then selects one voltage of ½ V from among the plurality of voltages into which the basic voltage V is divided by the ladder resistor 3 as the reference voltage Vref.

Then the timing generator 13 generates a timing pulse to turn on the third switch 12, and, after that, further generates a timing pulse to turn on the second switch 11. As a result, the input and output of the inverter 9 have identical potentials $V_0$ which are determined by the input/output characteristic of the inverter 9. After that, the capacitor 8 is charged to the difference between the potential $V_0$ and the input voltage Vin applied to the input terminal 7. When the capacitor 8 becomes charged, the timing generator 13 generates a timing pulse to turn off the second and third switches 11 and 12 sequentially. After that, the timing generator 13 further generates a timing pulse to turn on the first switch 10. At that time, the switch group is furnishing, as the reference voltage Vref, a voltage having a value of ½ V which corresponds to the value of the digital data written into the successive approximation register 2 by the control circuit 1, i.e., a hexadecimal number "8h".

When the reference voltage Vref furnished by the switch group 6 is applied to the capacitor 8 by way of the first switch 10, the reference voltage Vref is compared with the input voltage Vin. In this case, since the reference voltage is ½ V and the input voltage Vin is 0.63 V, and hence Vin>Vref, the inverter 9 outputs a signal having a value of zero. When the control circuit 1 receives the signal at a logical state 0 from the inverter 9, it changes the digital data to be delivered to the successive approximation register from the previous hexadecimal number "8h" to a hexadecimal number "Ch". As a result, the value of the reference voltage Vref furnished by the switch group 6 changes from ½ V to ¾ V. As previously explained, before the reference voltage Vref starts to make a transition to a new value, the AD converter causes the timing generator 13 to generate a timing pulse to turn off the first switch 10 only if the amount of change in the reference voltage Vref is greater than or equal to a predetermined value, e.g., ¼ V, and, after that, the first switch 10 is held in the off state until the reference voltage Vref becomes stable. In the above case, the reference voltage Vref changes from ½ V to ¾ V, that is, the amount of change in the reference voltage Vref is ¼ V. Therefore, in the case where the predetermined value is ¼ V, the timing generator 13 holds the first switch 10 in its off state until the reference voltage 10 becomes stable, that is, during a period of time from the time the reference voltage Vref starts to change to a new value until the time it is stabilized at the new value.

When the reference voltage Vref has been stabilized at ¾ V and then the first switch 10 is turned on in response to a timing pulse generated by the timing generator 13, the reference voltage Vref is applied to the capacitor 8 by way of the first switch 10. Then a comparison between the input voltage Vin held by the capacitor and the reference voltage Vref is carried out. In this case, the reference voltage Vref is ¾ V and the input voltage Vin is 0.63 V. Thus, since Vin<Vref, the converter 9 outputs a signal at a logical state 1. According to the output of the inverter 9, the control circuit 1 changes the digital data to be delivered to the successive approximation register to a hexadecimal number "Ch". As a result, the value of reference voltage Vref furnished by the switch group 6 changes from ¾ V to ⅝ V. In this case, since the amount of change in the reference voltage Vref is ⅛ V, the first switch 10 remains in its on state.

In the following comparing process, the first switch 10 does not perform its on/off operation, that is, the first switch is held in its previous state, like the second and third switches 11 and 12. Accordingly, the unstable reference voltage Vref which is making a transition to a new value under the control of the switch group 6 is applied to the capacitor 8. Then the comparator can carry out a comparison for the AD conversion. There is a possibility that a comparison between the reference voltage Vref which has not become stable yet and the input voltage Vin is carried out. However, when the amount of change in the reference voltage is smaller than the predetermined value, a deviation of the unstable reference voltage Vref in transition from its new value is small and therefore it has little effect on the conversion accuracy. Finally, the successive approximation register 2 of the AD converter furnishes as an AD conversion result a hexadecimal number "Ah" which corresponds to the value, i.e., 0.63 V of the input potential Vin at the time just before the second switch 11 switches to the off state.

As previously explained, the AD conversion controlling method according to the second embodiment of the present invention has a step of, only if the amount of change in the reference voltage Vref is greater than or equal to a predetermined value, turning off and holding the first switch 10 in the off state in order to prevent the unstable reference voltage Vref in transition under the control of the switch group 6 from being applied to the capacitor 8 until the reference voltage Vref becomes stable. Thus, the embodiment of the present invention can offer an advantage of providing an AD converter controlling method which can improve the conversion accuracy. Furthermore, since a number of times that the first switch 10 is held in the off state is reduced, this embodiment can offer another advantage of being able to speed up the AD conversion processing.

Third Embodiment

An AD converter controlling method according to the third embodiment of the present invention has the steps of turning off the first switch 10 before the reference voltage Vref starts to make a transition to a new value and then holding the first switch 10 in the off state until the reference voltage Vref becomes stable, and repeating the turning off and holding step only a predetermined number of times.

Figure 3:
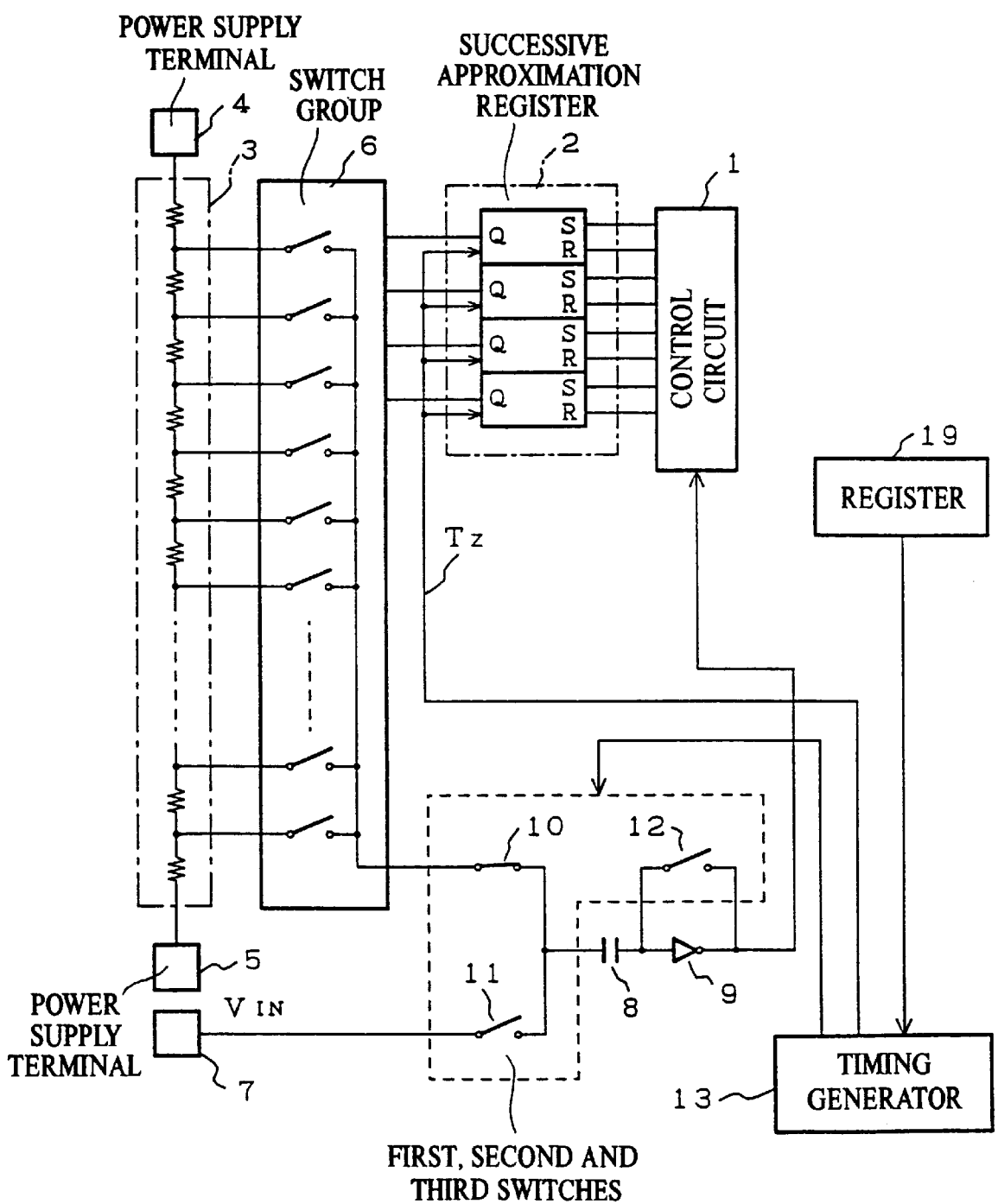
FIG. 3 is a block diagram showing the structure of an AD converter to which an AD converter controlling method according to a third embodiment of the present invention is applicable.

Referring next to FIG. 3, there is illustrated a block diagram showing the structure of an AD converter to which the AD converter controlling method according to the third embodiment of the present invention is applicable. In the figure, reference numeral 19 denotes a register into which a predetermined number of times that the AD converter repeats the step of turning off and holding the first switch 10 in the off state during an AD conversion processing can be written by using a software program. The timing generator 13 generates and furnishes a plurality of timing pulses to the first switch 10 sequentially in such a manner that the turning off and holding step is repeated only the set number of times given by the setting written into the register 19. The other structure of the AD converter of this embodiment is the same as that of the AD converter shown in FIG. 18, and therefore the description about the other structure of the AD converter will be omitted hereinafter.

Figure 4:
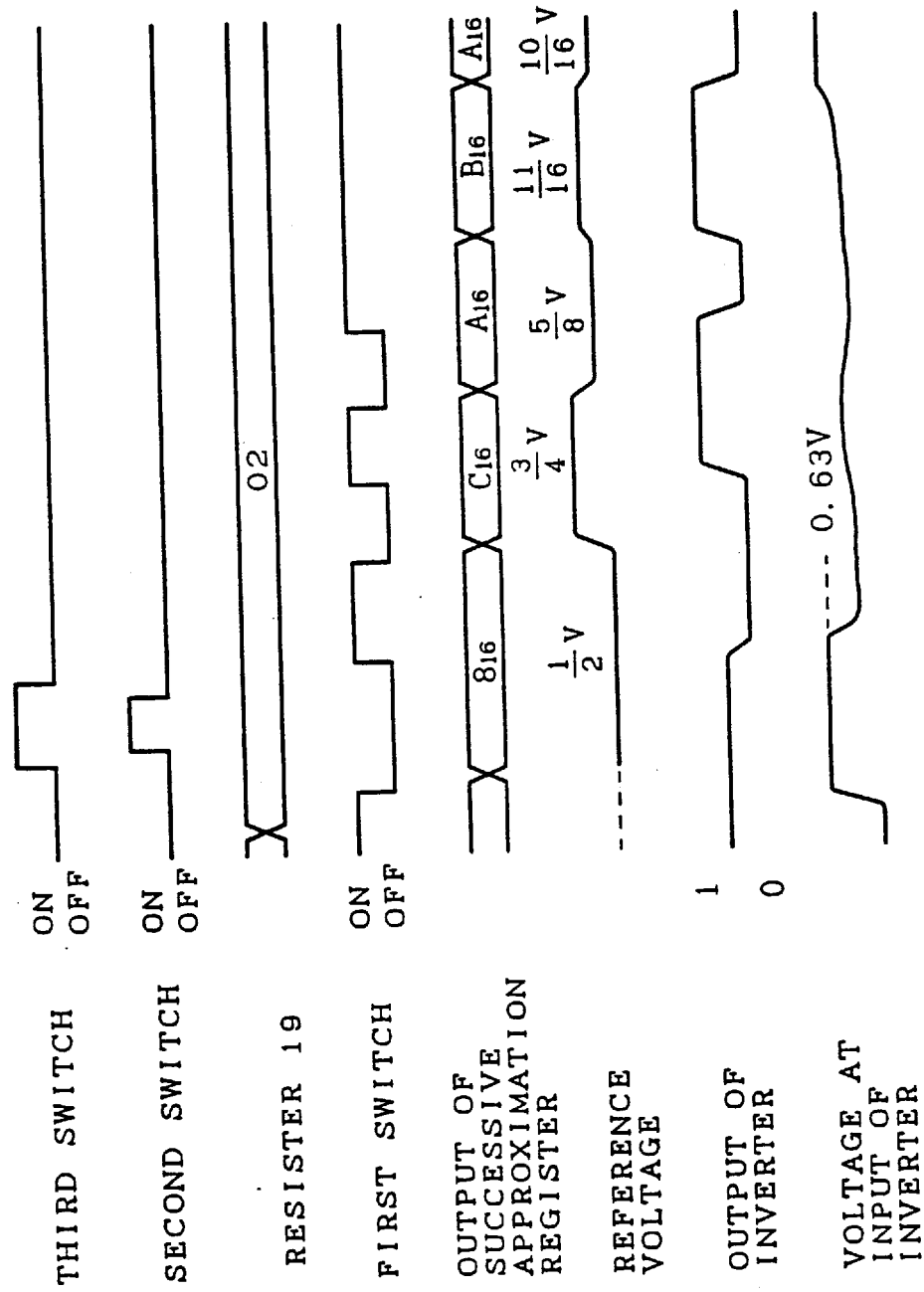
FIG. 4 is a timing diagram for explaining the operation of the AD converter controlling method according to the third embodiment of the present invention.

Referring next to FIG. 4, there is illustrated a timing diagram for explaining the operation of the AD converter shown in FIG. 3 which can implement the AD converter controlling method according to the third embodiment of the present invention. In advance of starting an AD conversion operation, a predetermined number of times that the first switch 10 is turned off before the reference voltage makes a transition to a new value and is held in the off state until the reference voltage becomes stable is written into the register 19 by using a software program. The timing diagram in FIG. 4 shows the case where a setting of "02" is written, as the predetermined number of times that the first switch 10 is turned on and is held in the off state, into the register 19. Thus, the first switch 10 can be turned off and on sequentially only an arbitrary number of times, which depends on the contents of the register 19 which has been set in advance of performing an AD conversion operation, during the AD conversion.

The AD conversion operation of the third embodiment is substantially the same as those of the first and second embodiments, except that the number of times that the first switch 10 is turned off and is held in the off state has been set in advance of the AD conversion operation. Every time the timing generator 13 causes the successive approximation register 2 to furnish a new digital data stored in the successive approximation register 2 to the switch group 6 so as to cause the reference voltage Vref to make a transition from its previous value to a new value determined by the new digital data after the capacitor 8 has been charged with the input voltage Vin, the timing generator 13 generates a timing pulse to turn off the first switch 10 to hold the first switch 10 in the off state until the reference voltage Vref becomes stable, unless the number of times that the turning off and holding operation on the first switch 10 has been repeated exceeds the setting written into the register 19. After that, the timing generator 13 further generates a timing pulse to turn on the first switch 10. As a result, the reference voltage Vref furnished by the switch group 6 is applied to the capacitor 8 by way of the first switch 10, and the reference voltage Vref is compared with the input voltage Vin. When the turning off and holding control operation on the first switch 10 has been repeated only the predetermined number of times (twice in the example shown in FIG. 4) preset into the register 19, the timing generator 13 generates no timing pulse to turn off the first switch 10 even though the reference voltage Vref makes a transition to a new value.

When the third or later transition in the reference voltage Vref is made, the first switch 10 does not perform the aforementioned turning off and on sequential operation and hence the first switch 10 is held in the on state. Accordingly, the unstable reference voltage Vref which is making a transition to a new value under the control of the switch group 6 is applied to the capacitor 8. There is thus a possibility that a comparison between the reference voltage Vref which has not become stable yet and the input voltage Vin is carried out. However, since the amount of change in the reference voltage Vref during the third or later transition is small, a deviation of the unstable reference voltage Vref in transition under the control of the switch group from its new value is small and therefore it has little effect on the conversion accuracy. Finally, the successive approximation register 2 of the AD converter furnishes as an AD conversion result a hexadecimal number "Ah" which corresponds to the value, i.e., 0.63 V of the input potential Vin at the time just before the second switch 11 switches to the off state.

As previously explained, the AD conversion controlling method according to the third embodiment of the present invention has a step of presetting the number of times that the first switch 10 is turned off and is held in the off state to an arbitrary number, and holding the first switch 10 in its off state during the interval that the amount of change in the reference voltage Vref is large to such an extent that the unstable reference voltage Vref in transition under the control of the switch group 6 exerts a bad influence upon the conversion accuracy. Furthermore, the first switch 10 can be controlled such that it is not switched to its off state when the amount of change in the reference voltage Vref is small to such an extent that the unstable reference voltage Vref in transition under the control of the switch group 6 does not exert a bad influence upon the conversion accuracy. Thus, the embodiment of the present invention can offer an advantage of speeding up the AD conversion processing and improving the conversion accuracy.

Fourth Embodiment

Figure 5:
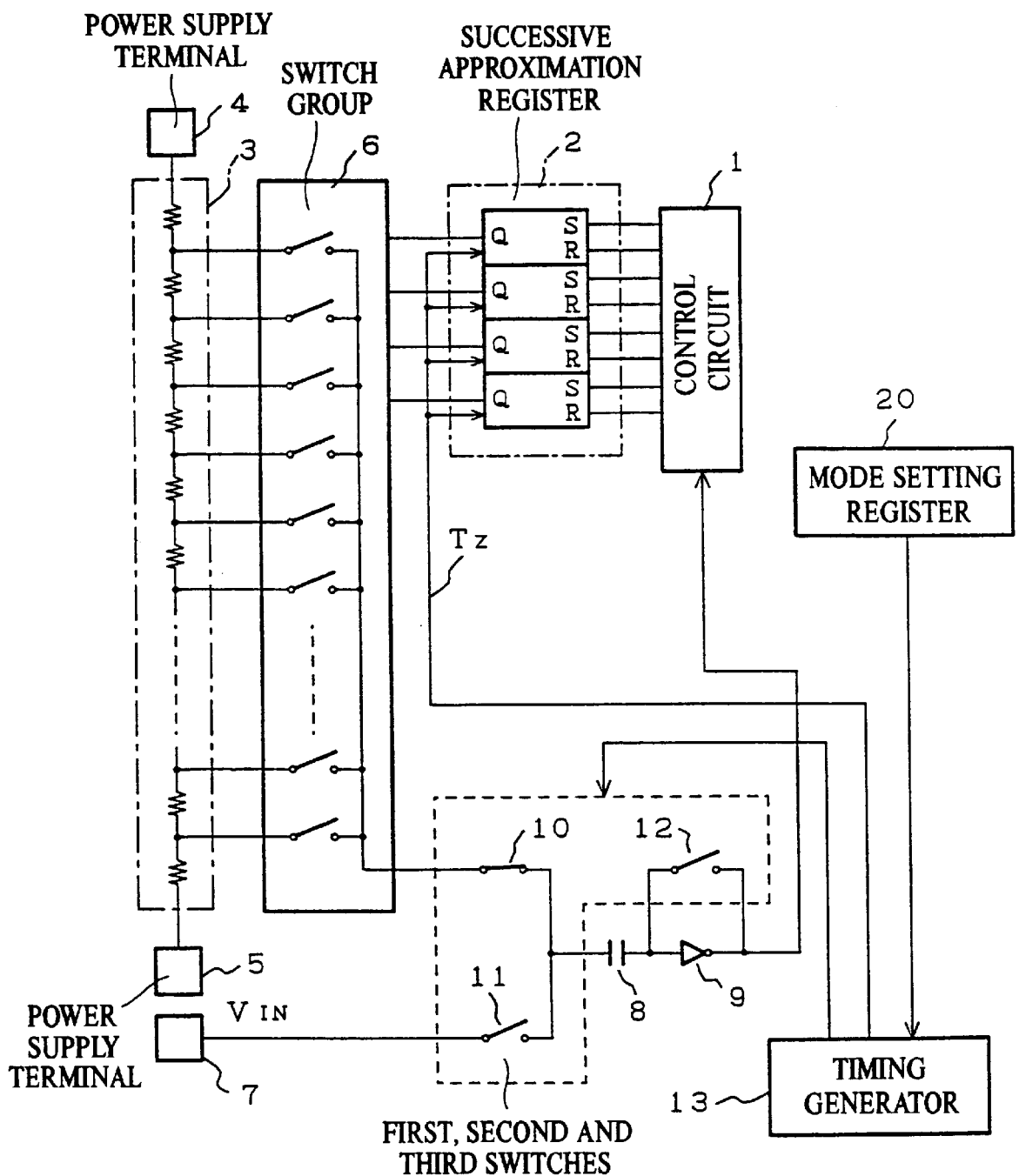
FIG. 5 is a block diagram showing the structure of an AD converter to which AD converter controlling methods according to fourth and fifth embodiments of the present invention are applicable.

In any one of the first to third embodiments of the present invention, the first switch 10 can be put into only one operational mode, as mentioned above. On the contrary, an AD converter controlling method according to the fourth embodiment of the present invention further comprises the steps of providing a plurality of operational modes each defining the operation of the first switch 10, and causing the first switch 10 to switch between the plurality of operational modes in response to a switching signal. Referring next to FIG. 5, there is illustrated a block diagram showing the structure of an AD converter in which the first switch 10 can switch between the plurality of operational modes. In the figure, reference numeral 20 denotes a mode setting register into which information for selecting one operation mode defining the operation of the first switch 10 is written by using a software program. The mode setting register 20 can furnish a switching signal having a value which corresponds to the information set therein. The timing generator 13 can generate timing pulses according to the switching signal from the mode setting register 20, and furnish the timing pulses to the first switch 10. The other structure of the AD converter is the same as that of the AD converter shown in FIG. 18, to which the AD converter controlling method of the first embodiment is applicable, and therefore the description of the other structure of the AD converter shown in FIG. 5 will be omitted hereinafter.

According to the AD converter controlling method of this fourth embodiment, there are provided a first operational mode wherein the timing generator 13 generates a timing pulse to turn off the first switch 10 before the reference voltage Vref starts to make a transition to its new value, so as to hold the first switch 10 in the off state until the reference voltage Vref becomes stable, and then the timing generator further generates a timing pulse to turn on the first switch 10 when the reference voltage is stabilized at its new value, and a second mode wherein after the capacitor 8 has been charged with the input voltage Vin, the timing generator 13 generates a timing pulse to turn off the second and third switches 11 and 12, and then the timing generator 13 further generates a timing pulse to turn on the first switch 10 so as to hold the first switch 10 in the on state.

Referring next to FIGS. 6a and 6b, there are illustrated timing diagrams for explaining the operation of the AD converter shown in FIG. 5 which can implement the AD converter controlling method according to the fourth embodiment of the present invention. FIG. 6a shows timing pulses generated by the timing generator 13 which is placed in the first operational mode and the switching signal from the mode setting register 20 which puts the timing generator 13 into the first operational mode. FIG. 6b shows timing pulses generated by the timing generator 13 which is placed in the second operational mode and the switching signal from the mode setting register 20 which puts the timing generator 13 into the second operational mode. In advance of starting an AD conversion operation, it is necessary to set the mode setting register 20 by using a software program. The software-programmable mode setting register 20 determines whether the timing generator 13 controls the first switch 10 according to either the first operational mode or the second operational mode. For example, when selecting the first operational mode, a binary number 1 is written into the mode setting register 20. Whereas a binary number 0 is written into the mode setting register 20 when selecting the second operational mode.

When the binary number 1 is written into the mode setting register 20 by using the software program, the switching signal delivered to the timing generator 13 changes to a logical high state. When the timing generator 13 receives the switching signal, it is put into the first operational mode. Every time the reference voltage Vref makes a transition to its new value, the timing generator 13 placed in the first operational mode generates a timing pulse to turn off the first switch 10, as shown in FIG. 6a. The first switch 10 is thus controlled by the timing generator 13 placed in the first operational mode. That is, the first switch 10 operates just as in the case of the first embodiment, so that the AD converter carries out an AD conversion for the input voltage Vin.

On the other hand, when the binary number 0 is written into the mode setting register 20 by using the software program, the switching signal delivered to the timing generator 13 changes to a logical low state. When the timing generator 13 receives the switching signal, it is put into the second operational mode. After the second and third switches 11 and 12 have been turned off sequentially, the timing generator 13 placed in the second operational mode generates a timing pulse to turn on the first switch 10 so as to hold the first switch 10 in the on state, as shown in FIG. 6b. The first switch 10 is thus controlled by the timing generator placed in the second operational mode. That is, the first switch 10 operates just as in the case of the prior art method, so that the AD converter carries out an AD conversion for the input voltage Vin.

As previously mentioned, the AD converter controlling method according to the fourth embodiment can set information indicating whether the timing generator controls the first switch 10 according to either the first operational mode which is the same as the only one operational mode of the method of the first embodiment or the second operational mode which is the same as the only one operational mode of the prior art method, into the mode setting register 20 by using a software program. Thus, the fourth embodiment offers an advantage of being able to provide an AD converter which can fit the needs of the user.

Fifth Embodiment

In the above-mentioned fourth embodiment, the timing generator is adapted to control the first switch 10 according to either the first operational mode or the second operational mode. On the contrary, an AD converter controlling method according to the fifth embodiment of the present invention controls the first switch 10 according to either a first operational mode which is the same as the only one operational mode of the method of the second embodiment or a second operational mode which is the same as the only one operational mode of the prior art method.

Although the structure of an AD converter to which the AD converter controlling method according to the fifth embodiment is applicable has the same structure as the fourth embodiment shown in FIG. 5, the operation of the timing generator 13 according to this embodiment differs from that of the timing generator of the above-mentioned fourth embodiment in that in the first operational mode, the timing generator 13 generates a timing pulse to turn off the first switch 10 before the reference voltage Vref starts to make a transition to its new value only if the amount of change in the reference voltage is greater than or equal to a predetermined value, so as to hold the first switch 10 in the off state until the reference voltage Vref becomes stable, and then the timing generator further generates a timing pulse to turn on the first switch 10, and, in the second operational mode, after the capacitor 8 has been charged with the input voltage Vin, the timing generator 13 generates a timing pulse to turn off the second and third switches 11 and 12, and then the timing generator 13 further generates a timing pulse to turn on the first switch 10 so as to hold the first switch 10 in the on state.

Figure 7A:
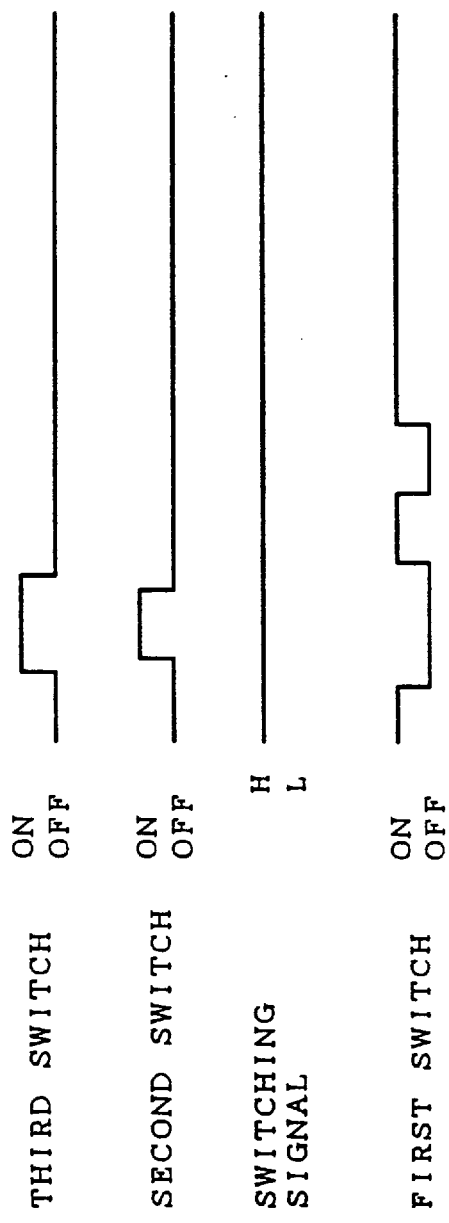
FIGS. 7a and 7b are timing diagrams for explaining the operation of the AD converter controlling method according to the fifth embodiment of the present invention.
Figure 7B:
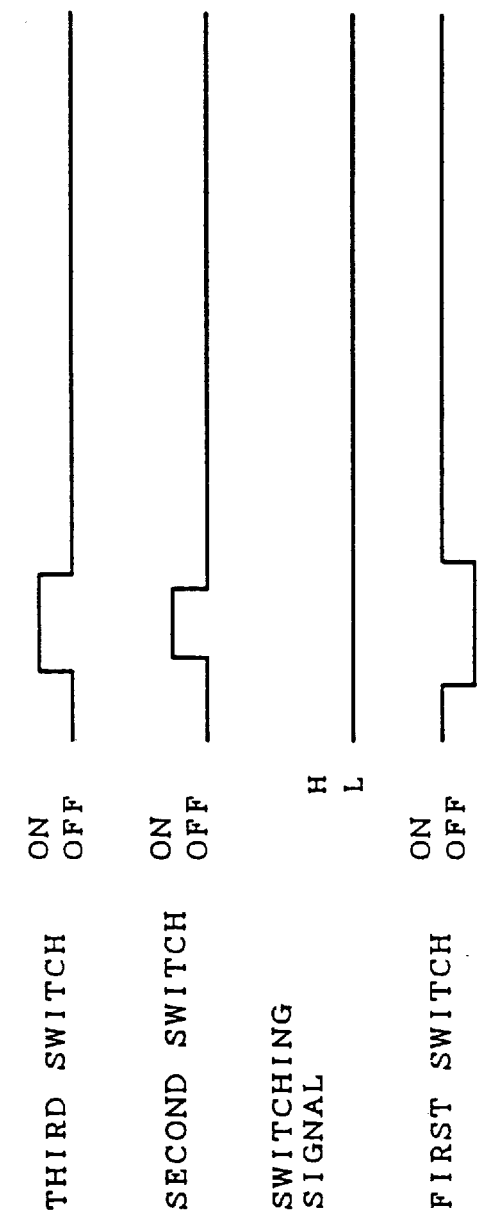

Referring next to FIGS. 7a and 7b, there are illustrated timing diagrams for explaining the operation of the AD converter shown in FIG. 5 which can implement the AD converter controlling method according to the fifth embodiment of the present invention. FIG. 7a shows timing pulses generated by the timing generator 13 which is placed in the first operational mode and the switching signal from the mode setting register 20 which puts the timing generator 13 into the first operational mode. FIG. 7b shows timing pulses generated by the timing generator 13 which is placed in the second operational mode and the switching signal from the mode setting register 20 which puts the timing generator 13 into the second operational mode. In advance of starting an AD conversion operation, a binary number 1 is written into the mode setting register 20 when selecting the first operational mode, like the fourth embodiment. Whereas a binary number 0 is written into the mode setting register 20 when selecting the second operational mode.

When a binary number 1 is written into the mode setting register 20 by using the software program, the switching signal delivered to the timing generator 13 goes to a logical high state. When the timing generator 13 receives the switching signal, it is put into the first operational mode. Before the reference voltage Vref starts to make a transition to a new value, the timing generator 13 placed in the first operational mode generates a timing pulse to turn off the first switch 10 only if the amount of change in the reference voltage Vref is greater than or equal to a predetermined value, as shown in FIG. 7a. Thus, the first switch 10 is controlled by the timing generator placed in the first operational mode. That is, the first switch 10 operates just as in the case of the second embodiment, so that the AD converter carries out an AD conversion for the input voltage Vin.

On the other hand, when the binary number 0 is written into the mode setting register 20 by using the software program, the switching signal delivered to the timing generator 13 changes to a logical low state. When the timing generator 13 receives the switching signal, it is put into the second operational mode. After the second and third switches 11 and 12 have been turned off sequentially, the timing generator 13 placed in the second operational mode generates a timing pulse to turn on the first switch 10 so as to hold the first switch 10 in the on state, as shown in FIG. 7b. Thus, the first switch 10 is controlled by the timing generator placed in the second operational mode. That is, the first switch 10 operates just as in the case of the prior art method, so that the AD converter carries out an AD conversion for the input voltage Vin.

As previously mentioned, the AD converter controlling method according to the fifth embodiment can set information indicating whether the timing generator controls the first switch 10 according to either the first operational mode which is the same as the only one operational mode of the method of the second embodiment or the second operational mode which is the same as the only one operational mode of the prior art method, into the mode setting register 20 by using a software program. Thus, the fifth embodiment offers an advantage of being able to provide an AD converter which can fit the needs of the user.

Sixth Embodiment

Figure 8:
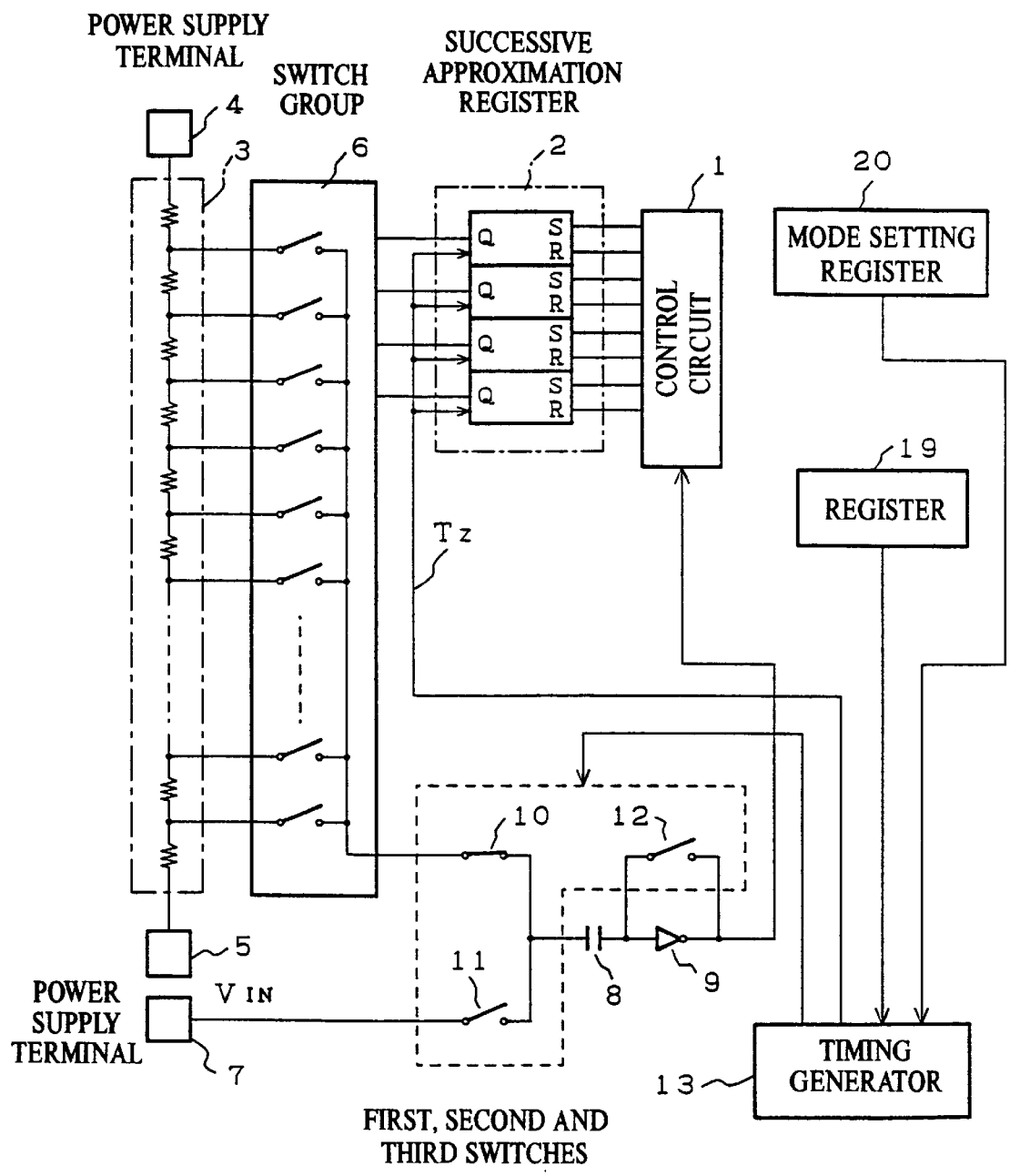
FIG. 8 is a block diagram showing the structure of an AD converter to which an AD converter controlling method according to a sixth embodiment of the present invention is applicable.

In any one of the aforementioned fourth and fifth embodiments of the present invention, the timing generator is adapted to control the first switch 10 according to either the first operational mode which is the same as the only one operational mode of the method of the first or second embodiment or the second operational mode which is the same as the only one operational mode of the prior art method. On the contrary, an AD converter controlling method according to the sixth embodiment of the present invention controls the first switch 10 according to either a first operational mode which is the same as the only one operational mode of the method of the third embodiment or a second operational mode which is the same as the only one operational mode of the prior art method. Referring next to FIG. 8, there is illustrated a block diagram showing the structure of an AD converter to which the AD converter controlling method according to the sixth embodiment of the present invention is applicable. In the figure, the same components as the AD converters shown in FIGS. 3 and 5 are designated by the same reference numerals, and therefore the description about the components of the AD converter shown in FIG. 8 will be omitted hereinafter.

The timing generator 13 generates timing pulses according to the switching signal from the mode setting register 20, and furnish these timing pulses to the first switch 10. In the first operational mode, the timing generator 13 carries out the following turning off and on sequential operation only a predetermined number of times preset in the register 19. During the sequential operation, the timing generator 13 generates a timing pulse to turn off the first switch 10 before the reference voltage Vref begins to make a transition to its new value, so as to hold the first switch 10 in the off state until the reference voltage Vref becomes stable, and then the timing generator further generates a timing pulse to turn on the first switch 10 when the reference voltage is stabilized at the new value. On the other hand, in the second operational mode, after the capacitor 8 has been charged with the input voltage Vin, the timing generator 13 generates a timing pulse to turn off the second and third switches 11 and 12, and then the timing generator 13 further generates a timing pulse to turn on the first switch 10 so as to hold the first switch 10 in the on state.

Referring next to FIGS. 9a and 9b, there are illustrated timing diagrams for explaining the operation of the AD converter shown in FIG. 8 which can implement the AD converter controlling method according to the sixth embodiment of the present invention. FIG. 9a shows timing pulses generated by the timing generator 13 which is placed in the first operational mode and the switching signal from the mode setting register 20 which puts the timing generator 13 into the first operational mode. FIG. 9b shows timing pulses generated by the timing generator 13 which is placed in the second operational mode and the switching signal from the mode setting register 20 which puts the timing generator 13 into the second operational mode. In advance of starting an AD conversion operation, a predetermined number of times (e.g., a binary number "02", as shown in FIG. 9a) that the first switch 10 is turned off and is held in the off state after an initial setting of the reference voltage Vref has been compared with the input voltage Vin, is written into the register 19. Furthermore, like the fourth and fifth embodiments, when selecting the first operational mode, a binary number 1 is written into the mode setting register 20. Whereas a binary number 0 is written into the mode setting register 20 when selecting the second operational mode.

When the binary number 1 is written into the mode setting register 20 by using the software program, the switching signal delivered to the timing generator 13 changes to a logical high state. When the timing generator 13 receives the switching signal, it is put into the first operational mode. As a result, the timing generator 13 placed in the first operational mode generates a timing pulse to turn off the first switch 10, before the reference voltage Vref begins to make a transition to a new value, only the predetermined number of times (i.e., only twice), as shown in FIG. 9a. Thus, the first switch 10 is controlled by the timing generator placed in the first operational mode. That is, the first switch 10 operates just as in the case of the third embodiment, so that the AD converter carries out an AD conversion for the input voltage Vin.

On the other hand, when the binary number 0 is written into the mode setting register 20 by using the software program, the switching signal delivered to the timing generator 13 goes to a logical low state. When the timing generator 13 receives the switching signal, it is put into the second operational mode. After the second and third switches 11 and 12 have been turned off sequentially, the timing generator 13 placed in the second operational mode generates a timing pulse to turn on the first switch 10 so as to hold the first switch 10 in the on state, as shown in FIG. 9b. The first switch 10 is thus controlled by the timing generator placed in the second operational mode. That is, the first switch 10 operates just as in the case of the prior art method, so that the AD converter carries out an AD conversion for the input voltage Vin.

As previously mentioned, the AD converter controlling method according to the sixth embodiment can set information indicating whether the timing generator controls the first switch 10 according to either the first operational mode which is the same as the only one operational mode of the method of the third embodiment or the second operational mode which is the same as the only one operational mode of the prior art method, into the mode setting register 20 by using a software program. Thus, the sixth embodiment offers an advantage of being able to provide an AD converter which can fit the needs of the user.

Seventh Embodiment

Figure 10:
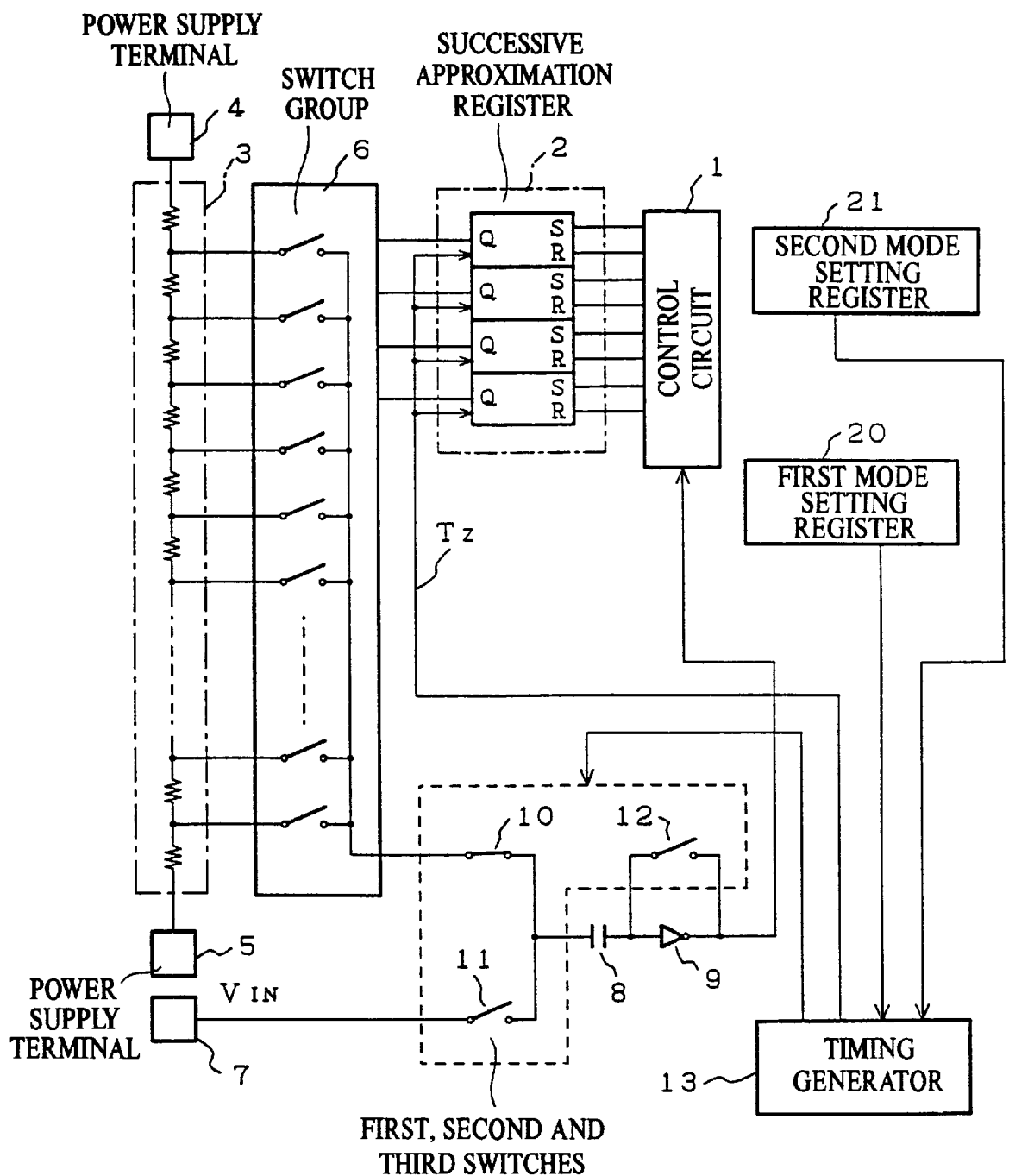
FIG. 10 is a block diagram showing the structure of an AD converter to which an AD converter controlling method according to a seventh embodiment of the present invention is applicable.

In any one of the fourth to sixth embodiments of the present invention, the timing generator is adapted to switch between the two operational modes, that is, the first operational mode which is the same as the only one operational mode of the method of the first, second, or third embodiment, and the second operational mode which is the same as the only one operational mode of the prior art method, so as to control the first switch 10. On the contrary, an AD converter controlling method according to the seventh embodiment of the present invention controls the first switch 10 according to one operational mode selected from among three operational modes, i.e., a first operational mode which is the same as the only one operational mode of the method of the first embodiment, a second operational mode which is the same as the only one operational mode of the method of the second embodiment, and a third operational mode which is the same as the only one operational mode of the prior art method. Referring next to FIG. 10, there is illustrated a block diagram showing the structure of an AD converter to which the AD converter controlling method according to the seventh embodiment of the present invention is applicable.

In FIG. 10, reference numerals 20 and 21 respectively denote first and second mode setting registers into which information for selecting one operation mode defining the operation of the first switch 10 is written by using a software program. The first mode setting register can furnish a first switching signal having a value which corresponds to the information set therein to the timing generator 13. The second mode setting register can furnish a second switching signal having a value which corresponds to the information set therein to the timing generator 13. The timing generator 13 can generate a timing pulse according to the first and second switching signals from the first and second mode setting registers 20 and 21, and furnish the timing pulse to the first switch 10. The other structure of the AD converter is the same as that of the AD converter shown in FIG. 5, and therefore the description of the other structure of the AD converter shown in FIG. 10 will be omitted hereinafter.

According to the AD converter controlling method according to the seventh embodiment, the timing generator 13 generates timing pulses according to the first and second switching signals from the first and second mode setting registers 20 and 21. In the first operational mode, every time the reference voltage Vref starts to change to a new value, the timing generator 13 generates a timing pulse to turn off the first switch 10 before the transition in the reference voltage Vref so as to hold it in the off state until the reference voltage Vref becomes stable, and then the timing generator further generates a timing pulse to turn on the first switch 10 when the reference voltage Vref is stabilized at the new value. In the second operational mode, only if the amount of change in the reference voltage Vref is greater than or equal to a predetermined value, the timing generator 13 generates a timing pulse to turn off the first switch 10 before the transition in the reference voltage Vref so as to hold it in the off state until the reference voltage Vref becomes stable, and then the timing generator further generates a timing pulse to turn on the first switch 10 when the reference voltage Vref is stabilized at the new value. In the third operational mode, after the capacitor 8 has been charged with the input voltage Vin, the timing generator 13 generates a timing pulse to turn off the second and third switches 11 and 12, and then the timing generator 13 further generates a timing pulse to turn on the first switch 10 so as to hold it in the on state.

Figure 11A:
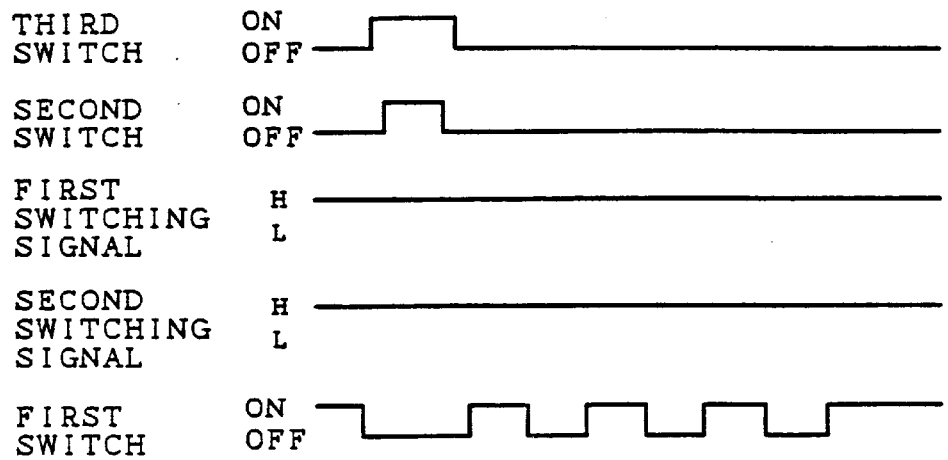
FIGS. 11a to 11c are timing diagrams for explaining the operation of the AD converter controlling method according to the seventh embodiment of the present invention.
Figure 11B:
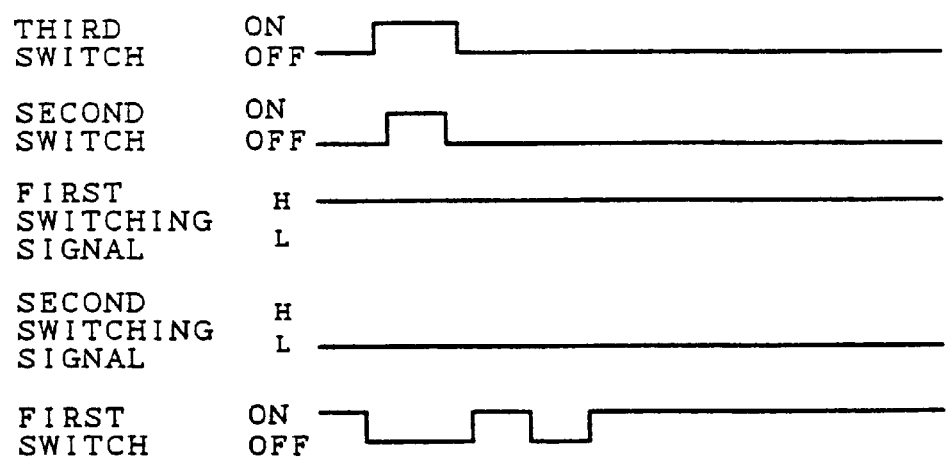
Figure 11C:
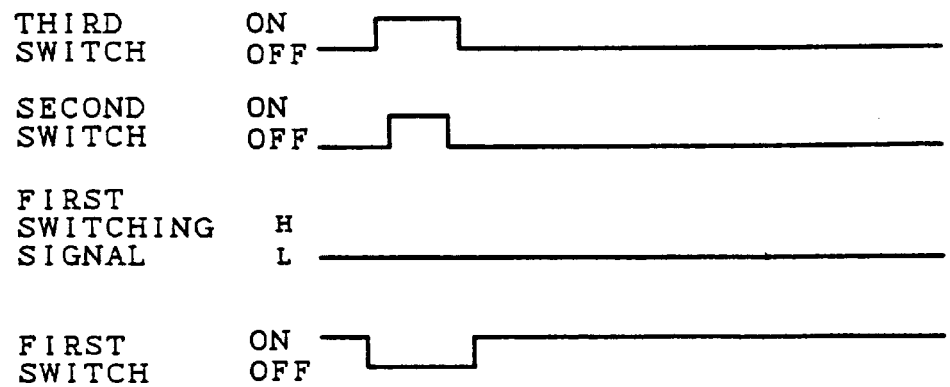

Referring next to FIGS. 11a to 11c, there are illustrated timing diagrams for explaining the operation of the AD converter shown in FIG. 10 which can implement the AD converter controlling method according to the seventh embodiment of the present invention. FIG. 11a shows timing pulses generated by the timing generator 13 which is placed in the first operational mode and the first and second switching signals from the mode setting registers 20 and 21 which put the timing generator 13 into the first operational mode. FIG. 11b shows timing pulses generated by the timing generator 13 which is placed in the second operational mode and the first and second switching signals from the mode setting registers 20 and 21 which put the timing generator 13 into the second operational mode. FIG. 11c shows timing pulses generated by the timing generator 13 which is placed in the third operational mode and the first switching signal from the first mode setting register 20 which puts the timing generator 13 into the third operational mode. In advance of starting an AD conversion operation, a binary number 1 is written into both the first and second mode setting registers 20 and 21 when selecting the first operational mode. When selecting the second operational mode, a binary number 1 is written into the first mode setting register 20 and a binary number 0 is written into the second mode setting register 21. When selecting the third operational mode, a binary number 0 is written into the first mode setting register 20.

When writing a binary number 1 into both the first and second mode setting registers 20 and 21 by using a software program, both the first and second switching signals delivered to the timing generator 13 change to logical high states. When the timing generator 13 receives such the first and second switching signals, it is put into the first operational mode. As a result, the timing generator 13 placed in the first operational mode generates a timing pulse to turn off the first switch 10 every time the reference voltage Vref starts to change to a new value, as shown in FIG. 11a. Thus, the first switch 10 is controlled by the timing generator placed in the first operational mode. That is, the first switch 10 operates just as in the case of the first embodiment, so that the AD converter carries out an AD conversion for the input voltage Vin.

When writing a binary number 1 into the first mode setting register 20 and writing a binary number 0 into the second mode setting register 21 by using the software program, the first switching signal delivered to the timing generator 13 changes to a logical high state and the second switching signal delivered to the timing generator 13 changes to a logical low state. When the timing generator 13 receives such the first and second switching signals, it is put into the second operational mode. As a result, before the reference voltage Vref starts to change to a new value, the timing generator 13 placed in the second operational mode generates a timing pulse to turn off the first switch 10 if the amount of change in the reference voltage Vref is greater than or equal to a predetermined value, as shown in FIG. 11b. Thus, the first switch 10 is controlled by the timing generator placed in the second operational mode. That is, the first switch 10 operates just as in the case of the second embodiment, so that the AD converter carries out an AD conversion for the input voltage Vin.

On the other hand, when writing a binary number 0 into the first mode setting register 20 by using the software program, the first switching signal delivered to the timing generator 13 changes to a logical low state even though either a 0 or a 1 is written into the second mode setting register 21. When the timing generator 13 receives the first switching signal at a logical low state, it is put into the third operational mode. After the second and third switches 11 and 12 have been turned off sequentially, the timing generator 13 placed in the third operational mode generates a timing pulse to turn on the first switch 10 so as to hold it in the on state, as shown in FIG. 11c. Thus, the first switch 10 is controlled by the timing generator placed in the third operational mode. That is, the first switch 10 operates just as in the case of the prior art method, so that the AD converter carries out an AD conversion for the input voltage Vin.

As previously mentioned, the AD converter controlling method according to the seventh embodiment can set information indicating whether the timing generator controls the first switch 10 according to the first operational mode which is the same as the only one operational mode of the method of the first embodiment, the second operational mode which is the same as the only one operational mode of the method of the second embodiment, or the third operational mode which is the same as the only one operational mode of the prior art method, into both the first and second mode setting registers 20 and 21 by using a software program. Thus, the seventh embodiment offers an advantage of being able to provide an AD converter which can fit the needs of the user.

Eighth Embodiment

Figure 12:
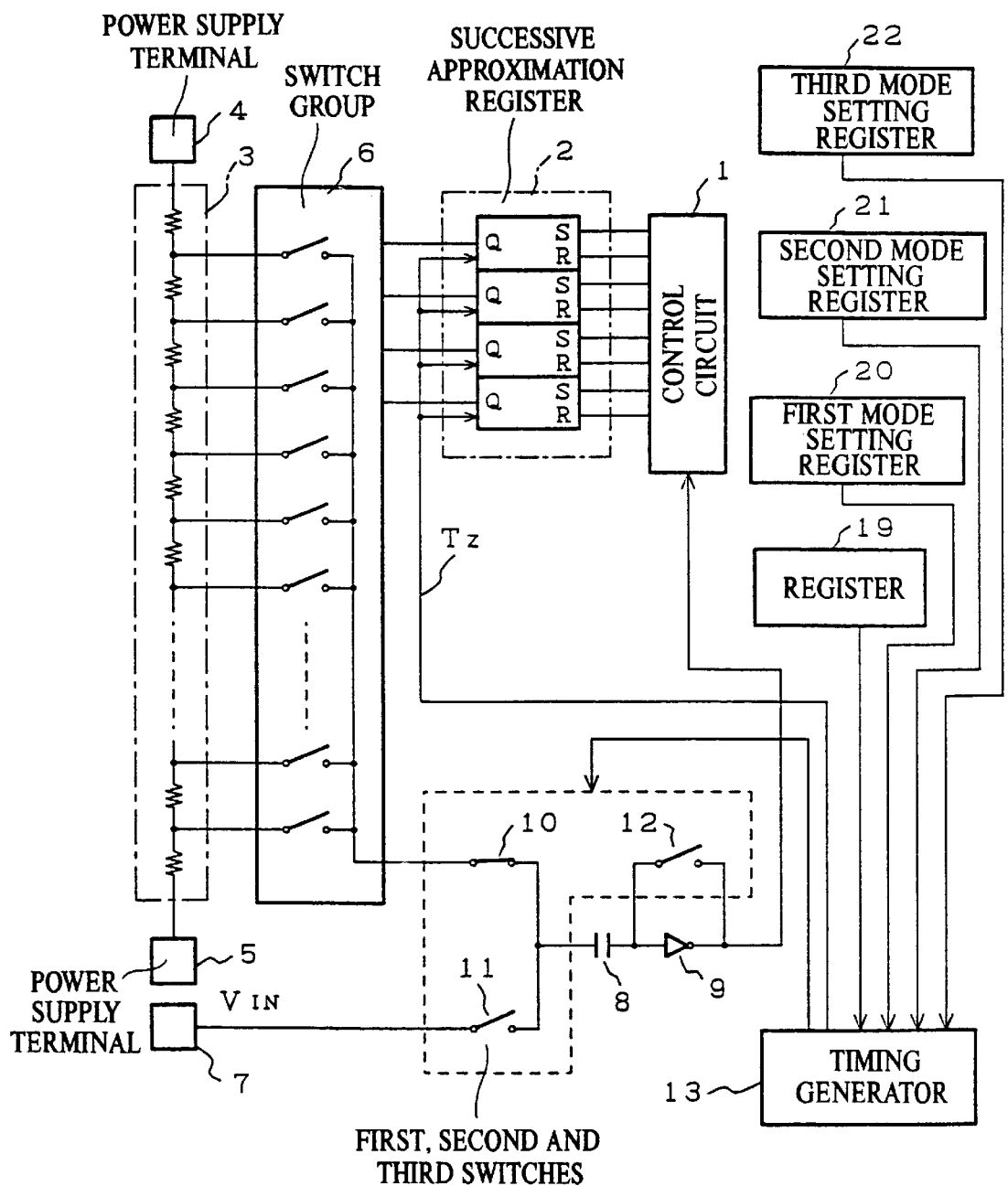
FIG. 12 is a block diagram showing the structure of an AD converter to which an AD converter controlling method according to an eighth embodiment of the present invention is applicable.

The timing generator according to the seventh embodiment of the present invention is adapted to switch between the three operational modes, that is, the first operational mode which is the same as the only one operational mode of the method of the first embodiment, the second operational mode which is the same as the only one operational mode of the method of the second embodiment, and the third operational mode which is the same as the only one operational mode of the prior art method, so as to control the first switch 10. On the contrary, an AD converter controlling method according to the eighth embodiment of the present invention controls the first switch 10 according to one operational mode selected from among four operational modes, i.e., a first operational mode which is the same as the only one operational mode of the method of the first embodiment, a second operational mode which is the same as the only one operational mode of the method of the second embodiment, a third operational mode which is the same as the only one operational mode of the method of the third embodiment, and a fourth operational mode which is the same as the only one operational mode of the prior art method. Referring next to FIG. 12, there is illustrated a block diagram showing the structure of an AD converter to which the AD converter controlling method according to the eighth embodiment of the present invention is applicable.

In FIG. 12, a reference numerals 22 denotes a third mode setting register into which information for selecting one operation mode defining the operation of the first switch 10 is written by using a software program as well as into the first and second mode setting registers 20 and 21. The third mode setting register 22 can furnish a third switching signal having a value which corresponds to the information set therein. The third switching signal is, together with the first and second switching signals from the first and second registers 20 and 21, injected into the timing generator 13. The timing generator 13 can generate a timing pulse according to the first to third switching signals from the first to third mode setting registers 20 to 22, and furnish the timing pulse to the first switch 10. The other structure of the AD converter is the same as that of the AD converter shown in FIG. 3, and therefore the description of the other structure of the AD converter shown in FIG. 12 will be omitted hereinafter.

According to the AD converter controlling method of the eighth embodiment, the timing generator 13 generates timing pulses according to the first to third switching signals from the first to third mode setting registers 20 to 22. In the first operational mode, every time the reference voltage Vref starts to change to a new value, the timing generator 13 generates a timing pulse to turn off the first switch 10 before the transition in the reference voltage Vref is started so as to hold the first switch in the off state until the reference voltage Vref becomes stable, and then the timing generator further generates a timing pulse to turn on the first switch when the reference voltage Vref is stabilized at the new value. In the second operational mode, only if the amount of change in the reference voltage Vref is greater than or equal to a predetermined value, the timing generator 13 generates a timing pulse to turn off the first switch 10 before the transition in the reference voltage Vref is started so as to hold the first switch in the off state until the reference voltage Vref becomes stable, and then the timing generator further generates a timing pulse to turn on the first switch when the reference voltage Vref is stabilized at the new value. In the third operational mode, the timing generator 13 carries out the following turning off and on sequential operation only a predetermined number of times preset in the register 19. During the sequential operation, the timing generator 13 generates a timing pulse to turn off the first switch 10 before the reference voltage Vref begins to make a transition to a new value, so as to hold the first switch 10 in the off state until the reference voltage Vref becomes stable, and then the timing generator further generates a timing pulse to turn on the first switch 10 when the reference voltage Vref is stabilized at the new value. In the fourth operational mode, after the capacitor 8 has been charged with the input voltage Vin, the timing generator 13 generates a timing pulse to turn off the second and third switches 11 and 12, and then the timing generator 13 further generates a timing pulse to turn on the first switch 10 so as to hold it in the on state.

Figure 13A:
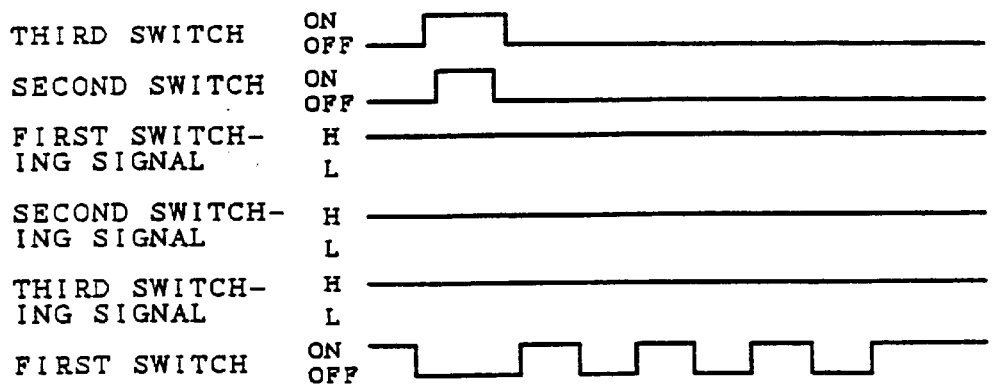
FIGS. 13a to 13d are timing diagrams for explaining the operation of the AD converter controlling method according to the eighth embodiment of the present invention.
Figure 13B:
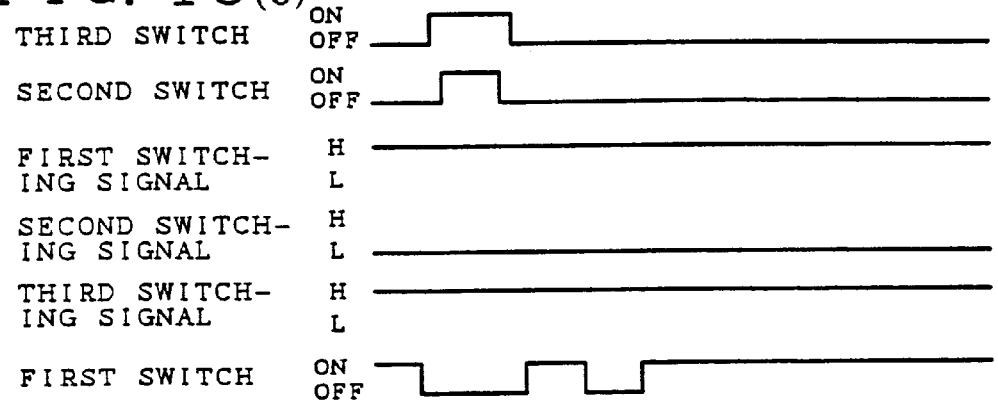
Figure 13C:
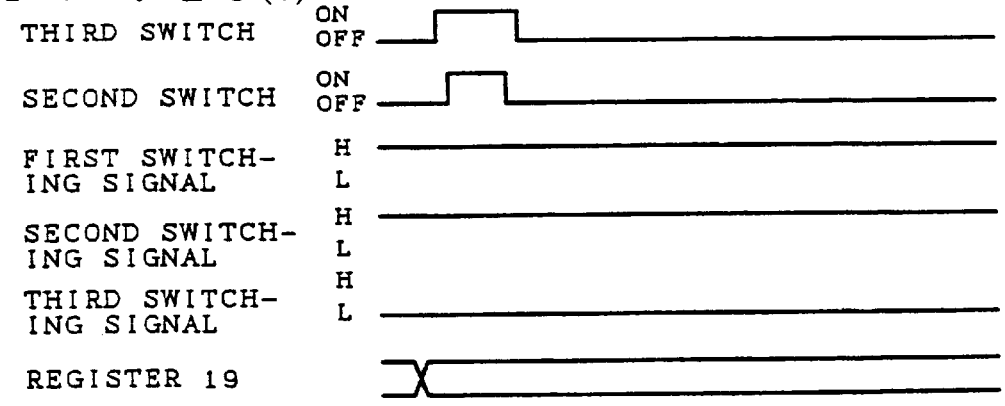
Figure 13D:
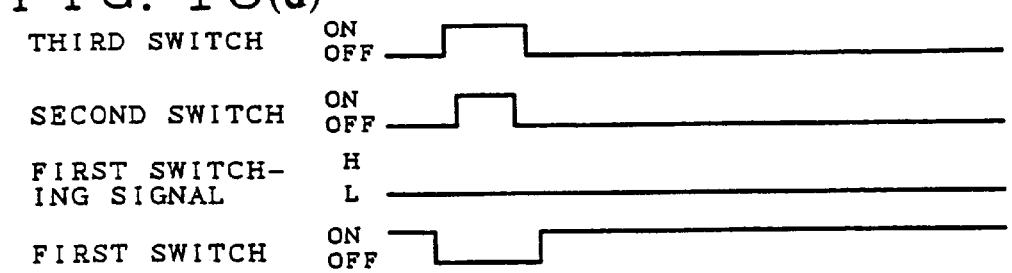

Referring next to FIGS. 13a to 13d, there are illustrated timing diagrams for explaining the operation of the AD converter shown in FIG. 12 which can implement the AD converter controlling method according to the eighth embodiment of the present invention. FIG. 13a shows timing pulses generated by the timing generator 13 which is placed in the first operational mode and the first to third switching signals from the first to third mode setting registers 20 to 22 which put the timing generator 13 into the first operational mode. FIG. 13b shows timing pulses generated by the timing generator 13 which is placed in the second operational mode and the first to third switching signals from the first to third mode setting registers 20 to 22 which put the timing generator 13 into the second operational mode. FIG. 13c shows timing pulses generated by the timing generator 13 which is placed in the third operational mode, the first to third switching signals from the first to third mode setting registers 20 to 22 which put the timing generator 13 into the third operational mode, and the setting stored in the register 19. FIG. 13d shows timing pulses generated by the timing generator 13 which is placed in the fourth operational mode and the first switching signal from the mode setting register 20 which puts the timing generator 13 into the fourth operational mode.

In advance of starting an AD conversion operation, a binary number 1 is written into all of the first to third mode setting registers 20 to 22 when selecting the first operational mode. When selecting the second operational mode, a binary number 1 is written into both the first and third mode setting registers 20 and 22 and a binary number 0 is written into the second mode setting register 21. When selecting the third operational mode, a binary number 1 is written into both the first and second mode setting registers 20 and 21 and a binary number 0 is written into the third mode setting register 22. Furthermore, a predetermined number of times (e.g., a binary number "02" as shown in FIG. 13c) that the first switch 10 is turned off and on sequentially after an initial setting of the reference voltage Vref has been compared with the input voltage Vin is written into the register 19. When selecting the fourth operational mode, a binary number 0 is written into the first mode setting register 20.

When writing a binary number 1 into all of the first to third mode setting registers 20 to 22 by using a software program, all of the first to third switching signals delivered to the timing generator 13 change to logical high states. When the timing generator 13 receives such the first to third switching signals, it is put into the first operational mode. As a result, every time the reference voltage Vref starts to change to a new value, the timing generator 13 placed in the first operational mode generates a timing pulse to turn off the first switch 10 before the transition in the reference voltage Vref is started, so as to hold the first switch in the off state until the reference voltage Vref becomes stable, as shown in FIG. 13a. Thus, the first switch 10 is controlled by the timing generator placed in the first operational mode. That is, the first switch 10 operates just as in the case of the first embodiment, so that the AD converter carries out an AD conversion for the input voltage Vin.

When writing a binary number 1 into both the first and third mode setting registers 20 and writing a binary number 0 into the second mode setting register 21 by using the software program, both the first and third switching signals delivered to the timing generator 13 change to logical high states and the second switching signal delivered to the timing generator 13 changes to a logical low state. When the timing generator 13 receives such the first to third switching signals, it is put into the second operational mode. As a result, before the reference voltage Vref starts to change to a new value, the timing generator 13 placed in the second operational mode generates a timing pulse to turn off the first switch 10 if the amount of change in the reference voltage is greater than or equal to a predetermined value, as shown in FIG. 13b. Thus, the first switch 10 is controlled by the timing generator placed in the second operational mode. That is, the first switch 10 operates just as in the case of the second embodiment, so that the AD converter carries out an AD conversion for the input voltage Vin.

When writing a binary number 1 into both the first and second mode setting registers 20 and 21 and writing a binary number 0 into the third mode setting register 22 by using the software program, both the first and second switching signals delivered to the timing generator 13 change to logical high states and the third switching signal delivered to the timing generator 13 changes to a logical low state. When the timing generator 13 receives such the first to third switching signals, it is put into the third operational mode. As a result, the timing generator 13 placed in the third operational mode generates a timing pulse to turn off the first switch 10, before the reference voltage Vref makes a transition to a new value, only the predetermined number of times (i.e., only twice), as shown in FIG. 13c. Thus, the first switch 10 is controlled by the timing generator placed in the third operational mode. That is, the first switch 10 operates just as in the case of the third embodiment, so that the AD converter carries out an AD conversion for the input voltage Vin.

On the other hand, when writing a binary number 0 into the first mode setting register 20 by using the software program, the first switching signal delivered to the timing generator 13 changes to a logical low state even though either a 0 or a 1 is written into the second and third mode setting registers 21 and 22. When the timing generator 13 receives the first switching signal at a logical low state, it is put into the fourth operational mode. After the second and third switches 11 and 12 have been turned off sequentially, the timing generator 13 placed in the fourth operational mode generates a timing pulse to turn on the first switch 10 so as to hold it in the on state, as shown in FIG. 13d. Thus, the first switch 10 is controlled by the timing generator placed in the fourth operational mode. That is, the first switch 10 operates just as in the case of the prior art method, so that the AD converter carries out an AD conversion for the input voltage Vin.

As previously mentioned, the AD converter controlling method according to the eighth embodiment can set information indicating whether the timing generator controls the first switch 10 according to the first operational mode which is the same as the only one operational mode of the method of the first embodiment, the second operational mode which is the same as the only one operational mode of the method of the second embodiment, the third operational mode which is the same as the only one operational mode of the method of the third embodiment, or the third operational mode which is the same as the only one operational mode of the prior art method, into the first to third mode setting registers 20 to 22 by using a software program. Thus, the eighth embodiment offers an advantage of being able to provide an AD converter which can fit the needs of the user.

Ninth Embodiment

Figure 14:
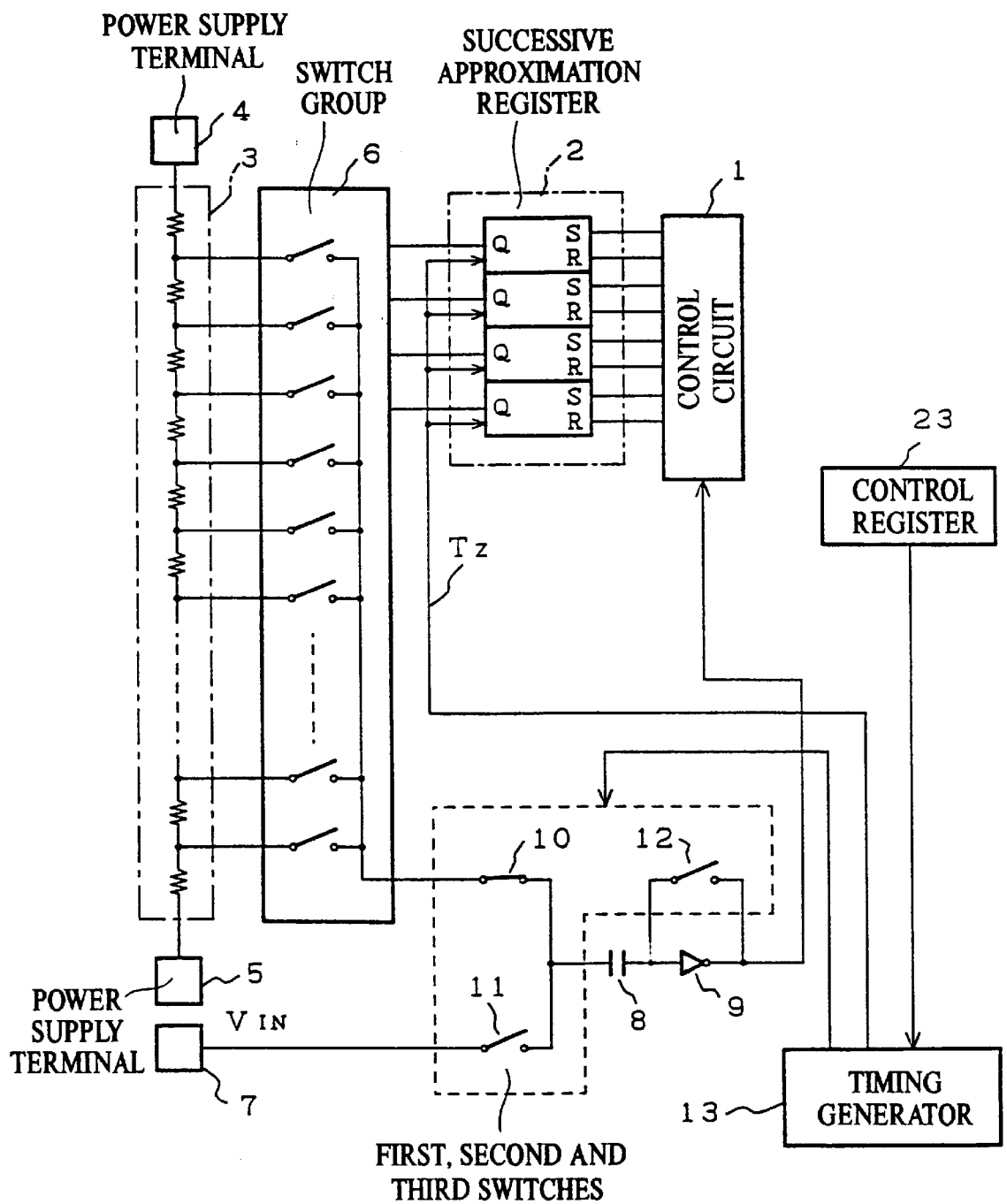
FIG. 14 is a block diagram showing the structure of an AD converter to which an AD converter controlling method according to a ninth embodiment of the present invention is applicable.

In the AD converter controlling method according to any one of the aforementioned embodiments, the timing generator 13 can be controlled in such a manner as to hold the first switch 10 in its off state until the reference voltage Vref becomes stable. In addition, the turning off and holding control operation on the first switch can be sequentially carried out for each of the first successive transitions in the reference voltage Vref. On the contrary, an AD converter controlling method according to the ninth embodiment of the present invention is adapted to carry out the above control operation for only at least a predetermined transition in the reference voltage Vref. Referring next to FIG. 14, there is illustrated a block diagram showing the structure of an AD converter to which the AD converter controlling method according to the ninth embodiment of the present invention is applicable. In FIG. 14, reference numeral 23 denotes a control register into which information for determining whether or not the timing generator 13 holds the first switch 10 in its off state during each transition in the reference voltage Vref is written by using a software program. The timing generator 13 can generate timing pulses according to the contents of the control register 23 sequentially, and furnish the timing pulses to the first switch 10. The other structure of the AD converter is the same as that of the AD converter according to the first embodiment shown in FIG. 18, and therefore the description of the other structure of the AD converter shown in FIG. 14 will be omitted hereinafter.

Referring next to FIG. 15, there is illustrated a timing diagram for explaining the operation of the AD converter which can implement the AD converter controlling method according to the ninth embodiment of the present invention. Furthermore, FIG. 16 shows an example of the setting stored in the control register 23. In advance of starting an AD conversion, information for determining whether or not the timing generator 13 holds the first switch 10 in its off state during each transition in the reference voltage Vref is written into the control register 23 by using a software program. In the example shown, a binary data "1101000 . . . " is set into the control register so that the first switch 10 is held in the off state during each of the first and third transitions in the reference voltage Vref, as shown in FIG. 16. Presetting the control register 23 thus makes it possible to hold the first switch in the off state during any given transition in the reference voltage Vref.

While the AD conversion operation of this embodiment is the same as that of any one of the aforementioned embodiments, the turning off and holding control operation on the first switch 10 differs from those of the aforementioned embodiments. Every time the timing generator 13 causes the reference voltage Vref to change to a new value by furnishing a timing pulse to trigger the successive approximation register 2 to deliver a new digital data written therein to the switch group 6, the timing generator 13 refers to the control register 23 to determine whether or not it furnishes a timing pulse to turn off the first switch to hold it in the off state during the transition in the reference voltage. In the above example, since the binary data stored in the control register 23 is 1010 . . . , as shown in FIG. 16, the timing generator 13 generates and furnishes a timing pulse to hold the first switch 10 in its off state to the first switch 10 during the first transition in the reference voltage Vref. The timing generator 13 further generates and furnishes a timing pulse to hold the first switch 10 in its off state to the first switch 10 during the third transition in the reference voltage Vref.

Thus, the first switch 10 controlled by the timing pulse furnished by the timing generator 13 is held in the off state during each of the first and third transitions in the reference voltage Vref until the reference voltage Vref becomes stable. On the other hand, the timing generator does not furnish a timing pulse to turn off the first switch 10 so as to hold it in the off state during any other transition other than the first and second transitions in the reference voltage Vref. Finally, the successive approximation register 2 of the AD converter furnishes an AD conversion result obtained by analog-to-digital converting the input voltage Vin at the time just before the second switch 11 switches to the off state.

As previously explained, the AD converter controlling method according to the ninth embodiment makes it possible to optionally hold the first switch 10 in either the off state or the on state during each transition in the reference voltage Vref. Therefore, since the method of this embodiment can hold the first switch in the off state throughout only a period of time during which the unstable reference voltage Vref making a transition to a new value can exert a bad influence upon the conversion accuracy, the embodiment offers an advantage of being able to speed up the AD converter and improve the conversion accuracy.

Tenth Embodiment

Figure 19:
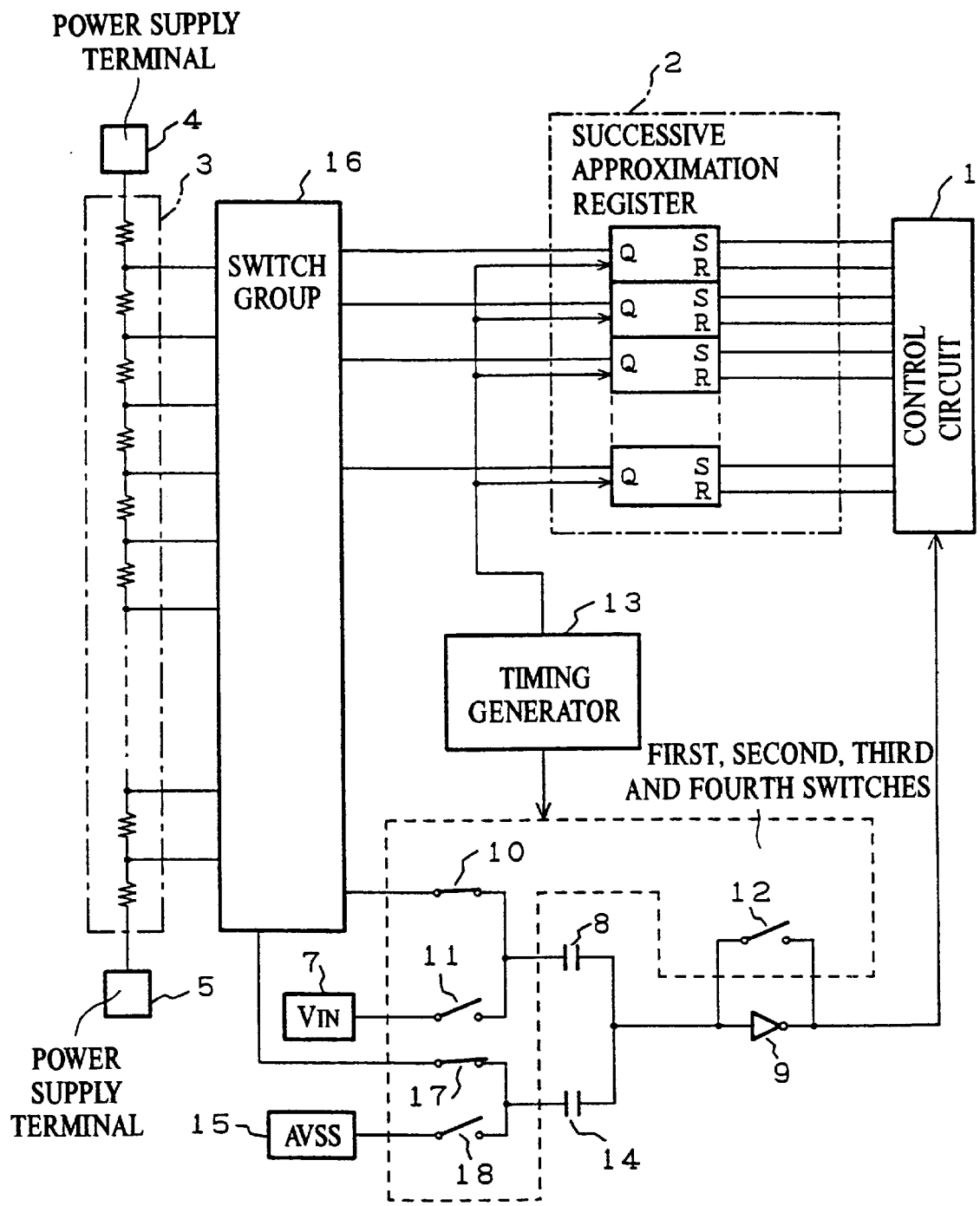
FIG. 19 is a block diagram showing the structure of a capacitance-coupled AD converter to which the AD converter controlling method according to the tenth embodiments of the present invention and the prior art AD converter controlling method are applicable.

The AD converter controlling method according to the present invention is applicable to a capacitance-coupled AD converter as well as to an successive approximation AD converter having a sample-and-hold function. As previously explained, FIG. 19 is a block diagram showing the structure of an example of a 8-bit capacitance-coupled AD converter to which the AD converter controlling method according to the present invention is applicable. In the figure, the same components as the successive approximation typed AD converter with a sample-and-hold function shown in FIG. 18 are designated by the same reference numerals, and therefore the description about the components will be omitted hereinafter. In FIG. 19, reference numeral 14 denotes a capacitor having one end connected to the input of the inverter 9. Hereinafter, the capacitor 14 will be referred to as the second capacitor in order to discriminate between the capacitor 14 and the capacitor 8 having one end similarly connected to the input of the inverter 9, which will be referred to as the first capacitor. Furthermore, reference numeral 15 denotes a base terminal to which a basic potential such as an analog basic potential AVSS from the integrated circuit including the AD converter is applied, and 16 denotes a switch group, which serves as a DA converter, comprised of a plurality of switches, which is different from the switch group 6 shown in FIG. 18 in that the switch group 16 can furnish a reference voltage Vref which is to be compared for obtaining the five uppermost bits of a conversion result and another reference voltage Vref which is to be compared for obtaining the three lowermost bits of the conversion result, separately.

Furthermore, reference numeral 17 denotes a fourth switch which can be turned on to apply the reference voltage Vref which is to be compared for obtaining the three lowermost bits to the other end of the second capacitor 14, and 18 denotes a fifth switch which can be turned on to apply the analog basic potential AVSS applied to the base terminal 15 to the other end of the second capacitor 14. A semiconductor switch such as a field-effect transistor analog switch can be used as each of the fourth and fifth switches 17 and 18, as is used as each of the first to third switches 10 to 12, which can be turned on or off in response to a timing pulse generated by the timing generator 13.

As mentioned above, the structure of the capacitance-coupled AD converter differs from that of the successive approximation AD converter having a sample-and-hold function as shown in FIG. 18 in that the first switch 10 serves to control the application of the reference voltage Vref for use in a comparison carried out to obtain the uppermost bits of a conversion result, the fourth switch 17 serves to control the application of the reference voltage Vref for use in a comparison carried out to obtain the lowermost bits of the conversion result, and the input of the inverter 9 is coupled to the analog basic potential AVSS by way of the second capacitor 14 when the fifth switch 18 is turned on.

Figure 17:
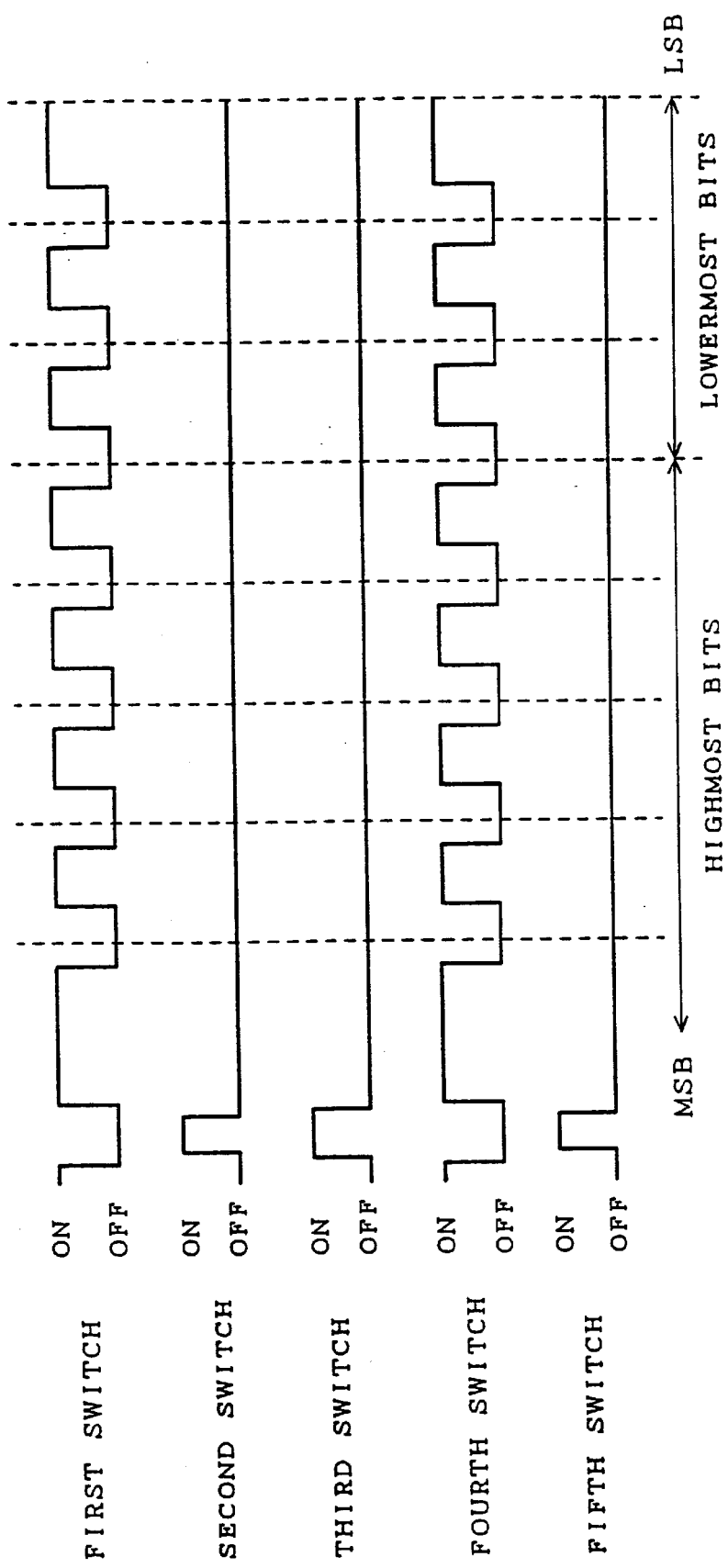
FIG. 17 is a timing diagram for explaining the operation of the AD converter controlling method according to a tenth embodiment of the present invention.

Referring next to FIG. 17, there is illustrated a timing diagram for explaining the operation of the capacitance-coupled AD converter shown in FIG. 19 which can implement the AD converter controlling method according to the tenth embodiment of the present invention. Hereinafter, the operation of the capacitance-coupled AD converter will be described by taking, as an example, an AD converter which can analog-to-digital convert the input voltage Vin into an 8-bit digital data by separately performing AD conversions for the five uppermost bits and three lowermost bits of a conversion result. The successive approximation register 2 is thus adapted to store 8 bits of information. Furthermore, the resistor ladder 3 is comprised of 256 resistor elements connected in series with each other and having identical resistance values, and the switch group 16 is comprised of 255 switches each connected to a corresponding point of connection located between two adjacent resistor elements of the ladder resister 3.

Although the second, third, and fifth switches 11, 12, and 18 are adapted to sequentially operate only when charging the first capacitor 8 and the second capacitor 14, the first and fourth switches 10 and 17 are adapted to operate independently of the second, third, and fifth switches 11, 12, and 18 after the first and second capacitors 8 and 14 have become charged. To be more specific, when converting the input voltage Vin into a digital data, the first and fourth switches 10 and 17 are turned off first. Then by turning on the third and second switches 12 and 11 sequentially, the input and output of the inverter 9 are short-circuited and the first capacitor 8 is charged to the difference between the input voltage Vin and the voltage $V_0$ defined by the input/output characteristic of the inverter 9. Furthermore, by turning on the fifth switch 18, the second capacitor 14 is charged to the difference between the analog basic potential AVSS and the voltage $V_0$. After the first and second capacitors 8 and 14 become charged, the second and fifth switches 11 and 18 are turned off and then the third switch 12 is turned off as well.

After that, the first and fourth switches 10 and 17 are turned on. Then an AD conversion is started to obtain the uppermost bits of a conversion result. When comparisons to obtain the uppermost bits are started, the reference voltage Vref furnished by the switch group 16 is applied to the first capacitor 8 by way of the first switch 10 which remains in the on state. Furthermore, during the comparisons to be carried out to obtain the uppermost bits, the switch group 16 supplies a constant voltage of 0 V to the fourth switch 17 which remains in the on state. The inverter 9 compares the reference voltage Vref with the sum of the charged voltages across the first and second capacitors 8 and 14, and then furnishes its output having a value which depends on the comparison result to the control circuit 1. The control circuit 1 changes the digital data to be delivered to the successive approximation register according to the value of the output of the inverter 9. Then the new digital data is stored in the successive approximation register 2. At that time, the timing generator 13 generates a timing pulse to turn off the first switch 10 and further generates a timing pulse to trigger the successive approximation register 2 to furnish the digital data stored therein to the switch group 6.

The reference voltage Vref to be furnished to the first switch 10 by the switch group 16 is thus updated according to the new digital data from the successive approximation register 2. At that time, while the second, fifth, and third switches 11, 18, and 12 are held in the off state, the first and fourth switches 10 and 17 have already switched from the on state to the off state. Therefore, the unstable reference voltage Vref in transition caused by the updating cannot be applied to the first capacitor 8, and, even though the constant voltage of 0 V is affected by the updating, it cannot be applied to the second capacitor 14. When the reference voltage Vref furnished by the switch group 16 becomes stable, the timing generator 13 generates a timing pulse to turn on the first and fourth switches 10 and 17.

When the first switch 10 switches to its on state, the stable reference voltage Vref is applied to the first capacitor 8 by way of the first switch 10. Furthermore, upon closing the fourth switch 17, the constant voltage of 0 V is applied to the second capacitor 14. At that time, since the first and second capacitors 8 and 14 are respectively held at the input voltage Vin and the basic voltage AVSS, with which the first and second capacitors 8 and 14 have been charged at the start of the AD conversion, the inverter 9 compares the sum of the charged voltages across the first and second capacitors 8 and 14 with the new reference voltage Vref to furnish an output having a value which depends on the comparison result to the control circuit 1. After that, a further AD conversion operation is similarly carried out to obtain the remainder of the five highmost bits.

When the AD conversion for the five uppermost bits is completed, the AD converter shifts to comparisons for the three lowermost bits. After the comparisons for the lowermost bits are started, a final voltage having a value which corresponds to the value of an AD conversion intermediate result the five uppermost bits of which have been determined by the above comparisons (all the three lowermost bits are set to 0) is constantly applied to the first capacitor 8 by way of the first switch 10 which remains in the on state. The reference voltage Vrefs used for comparisons for the lowermost bits is applied to the second capacitor 14 by way of the fourth switch 17 which remains in the off state. The initial value of the reference voltage Vrefs is equal to the difference between the input voltage Vin and the final voltage. During the comparisons for the lowermost bits, the final voltage having a value which corresponds to the value of the AD conversion intermediate result is constantly applied to the first capacitor 8 by way of the first switch 10 which remains in the on state. The inverter 9 compares the sum of the final voltage and the reference voltage Vrefs with the sum of the charged voltages across the first and second capacitors 8 and 14. Then the inverter 9 furnishes its output having a value which depends on the comparison result to the control circuit 1. The control circuit 1 changes the digital data to be delivered to the successive approximation register according to the value of the output of the inverter 9. Then the new digital data is stored in the successive approximation register 2. After that, the timing generator 13 generates a timing pulse to turn off the fourth switch 17 and further generates a timing pulse to trigger the successive approximation register 2 to furnish the new digital data stored therein to the switch group 16.

The reference voltage Vrefs used for an AD conversion for the lower bits, which is to be furnished by the switch group 16, is thus updated according to the new digital data from the successive approximation register 2. At that time, while the fifth, second, and third switched 18, 11, and 12 are held in the off state, the first and fourth switches 10 and 17 have already switched from the on state to the off state. Therefore, the unstable reference voltage Vrefs in transition caused by the updating cannot be applied to the second capacitor 14. Furthermore, even though the final voltage is affected by the updating, it cannot be applied to the first capacitor 8.

When the reference voltage Vrefs used for the comparisons for the lowermost bits, which is furnished by the switch group 16, becomes stable, the timing generator 13 generates a timing pulse to turn on the first and fourth switches 10 and 17. When the fourth switch 14 switches to its on state, the stable reference voltage Vrefs is applied to the second capacitor 14 by way of the fourth switch 17. Furthermore, upon closing the first switch 10, the final voltage is applied to the first capacitor 8. At that time, since the first and second capacitors 8 and 14 are respectively held at the input voltage Vin and the basic voltage AVSS, with which the first and second capacitors 8 and 14 have been charged at the start of the AD conversion, the inverter 9 compares the sum of the charged voltages across the first and second capacitors 8 and 14 with the sum of the reference voltage Vrefs used for the comparisons for the lowermost bits and the final voltage to furnish an output having a value which depends on the comparison result to the control circuit 1. After that, a further AD conversion operation is similarly carried out to obtain the remainder of the three lowermost bits.

As previously explained, the AD conversion controlling method according to the tenth embodiment of the present invention can control the first and fourth switches 10 and 17 independently of the other switches after the first and second capacitors 8 and 14 have become charged so that the first and fourth switches 10 and 17 are held in the off state throughout a period of time during which the conversion accuracy is susceptible to the unstable reference voltage in transition caused by the tap changing of the resistor ladder 3. Therefore, the unstable reference voltage Vref in transition, which is used for the uppermost bits conversion, and the unstable reference voltage Vrefs in transition, which is used for the lowermost bits conversion, cannot be applied to the first and second capacitors 8 and 14, respectively. The capacitance-coupled AD converter of this embodiment is thus immune to both the unstable reference voltage Vref and the unstable reference voltage Vrefs each making a transition to its new value under the control of the switch group 16. Thus, the embodiment of the present invention can offer an advantage of providing a capacitance-coupled AD converter controlling method which can offer a high degree of conversion accuracy.

In the above description, a 4-bit successive approximation AD converter having a sample-and-hold function, to which the AD converter controlling method according to any one of the first through ninth embodiments of the present invention is applicable, is taken as an example. Furthermore, an 8-bit capacitance-coupled AD converter, to which the AD converter controlling method according to the tenth embodiment of the present invention is applicable, is taken as an example. Those examples are described for simplicity, and it is needless to say that the present invention is not limited to the above examples.

As previously explained, the present invention offers the following advantages.

In accordance with a preferred embodiment of the present invention, there is provided a method of controlling an analog-to-digital (AD) converter which converts an input voltage into a digital data, comprising the steps of: charging a capacitor with the input voltage to be converted into a digital data; disconnecting the input voltage from the capacitor; applying a reference voltage into which a digital data furnished by a control circuit is converted by a digital-to-analog (DA) converting unit to the capacitor, by turning on a switch connected between the DA converting unit and the capacitor, so as to determine a new digital data to be furnished by the control circuit according to a charged voltage on the capacitor, so that the DA converting unit causes the reference voltage to be delivered to the capacitor to make a transition to a new value according to the new digital data from the control circuit; and, before the reference voltage starts to make a transition to a new value, optionally turning off the switch and then holding it in its off state until the reference voltage from the DA converting unit becomes stable at the new value. Accordingly, during the AD conversion operation, the switch is held in the off state while the reference voltage is changing to a new value. As a result, the unstable reference voltage in transition cannot be applied to the capacitor, and therefore a comparison between the input voltage and the reference voltage that has not become stable yet cannot be carried out. The embodiment offers an advantage of providing an AD converter controlling method which is immune to the unstable reference voltage making a transition to a new value, and which provides a high degree of conversion accuracy.

In accordance with another preferred embodiment of the present invention, every time the reference voltage from the DA converting unit makes a transition to a new value, the switch is turned off before the reference voltage starts to make a transition to a new value and then is held in its off state until the reference voltage becomes stable. Accordingly, a comparison between the input voltage and the reference voltage that has not become stable yet cannot be carried out. The embodiment offers an advantage of providing an AD converter controlling method which is immune to the unstable reference voltage making a transition to a new value, and which provides a high degree of conversion accuracy.

In accordance with another preferred embodiment of the present invention, only if the reference voltage from the DA converting unit makes a predetermined transition to a new value, the switch is turned off before the reference voltage starts to make a transition to a new value and then is held in its off state until the reference voltage becomes stable. Accordingly, a comparison between the input voltage and the reference voltage that has not become stable yet cannot be carried out when the reference voltage makes a predetermined transition which has been designated in advance of starting the AD conversion. Thus the AD conversion accuracy can be improved. Furthermore, since the turning off and holding control operation on the switch is not carried for all the transitions in the reference voltage, the embodiment offers an advantage of being able to speed up the AD conversion.

Preferably, only if the amount of change in the reference voltage which makes a transition to a new value is greater than or equal to a predetermined value, the switch is turned off before the reference voltage starts to make a transition to a new value and is then held it in its off state until the reference voltage becomes stable. Thus the embodiment offers an advantage of being able to improve the AD conversion accuracy, and speed up the AD conversion as well.

Alternatively, the method further comprises the step of presetting a number of times that the switch is turned off and is then held in its off state during a transition in the reference voltage. Furthermore, if a number of times that the reference voltage has made a transition to a new value does not exceed the preset number of times that the switch is turned off and is then held in its off state, the switch is turned off before the reference voltage starts to make a transition to a new value, and the switch is then held in its off state until the reference voltage becomes stable. Thus the embodiment offers an advantage of being able to improve the AD conversion accuracy, and speed up the AD conversion as well.

In accordance with another preferred embodiment of the present invention, the method further comprises the step of predetermining whether or not to hold the switch in its off state during each transition in the reference voltage. Furthermore, only if the reference voltage makes a predetermined transition to a new value which is designated by the above predetermining step, the switch is turned off before the reference voltage starts to make a transition to a new value, and the switch is then held it in its off until the reference voltage becomes stable. Thus the embodiment offers an advantage of being able to improve the AD conversion accuracy, and speed up the AD conversion as well.

In accordance with another preferred embodiment of the present invention, the method further comprises the steps of providing a plurality of operational modes each for defining the operation of the switch, selecting one from among the plurality of operational modes, and determining whether or not to turn off the switch before the reference voltage starts to make a transition to a new value and then hold the switch in its off state until the reference voltage becomes stable according to one operational mode selected. Thus the embodiment offers an advantage of being able to improve the AD conversion accuracy, and speed up the AD conversion as well. Furthermore, the embodiment offers an advantage of being able to provide an AD converter which can fit the needs of the user.

In accordance with another preferred embodiment of the present invention, there are provided a first operational mode in which every time the reference voltage from the DA converting unit makes a transition to a new value, the switch is turned off before the reference voltage starts to make a transition to a new value and is then held in its off state until the reference voltage becomes stable, and a second operational mode in which after the capacitor has become charged with the input voltage and then the input voltage is disconnected from the capacitor, the switch is held in its on state even though the reference voltage makes a transition to a new value. Thus the embodiment offers an advantage of being able to improve the AD conversion accuracy, and speed up the AD conversion as well. Furthermore, the embodiment offers an advantage of being able to provide an AD converter which can fit the needs of the user.

In accordance with another preferred embodiment of the present invention, there are provided a first operational mode in which only if the amount of change in the reference voltage which makes a transition to a new value is greater than or equal to a predetermined value, the switch is turned off before the reference voltage starts to make a transition to a new value and is then held in its off state until the reference voltage becomes stable, and a second operational mode in which after the capacitor has become charged with the input voltage and then the input voltage is disconnected from the capacitor, the switch is held in its on state even though the reference voltage makes a transition to a new value. Thus the embodiment offers an advantage of being able to improve the AD conversion accuracy, and speed up the AD conversion as well. Furthermore, the embodiment offers an advantage of being able to provide an AD converter which can fit the needs of the user.

In accordance with another preferred embodiment of the present invention, there are provided a first operational mode in which unless a number of times that the reference voltage has made a transition to a new value exceeds a predetermined number of times, the switch is turned off before the reference voltage starts to make a transition to a new value and the switch is then held in its off state until the reference voltage becomes stable, and a second operational mode in which after the capacitor has become charged with the input voltage and then the input voltage is disconnected from the capacitor, the switch is held in its on state even though the reference voltage makes a transition to a new value. Thus the embodiment offers an advantage of being able to improve the AD conversion accuracy, and speed up the AD conversion as well. Furthermore, the embodiment offers an advantage of being able to provide an AD converter which can fit the needs of the user.

In accordance with another preferred embodiment of the present invention, there are provided a first operational mode in which every time the reference voltage from the DA converting unit makes a transition to a new value, the switch is turned off before the reference voltage starts to make a transition to a new value and is then held in its off state until the reference voltage becomes stable, a second operational mode in which only if the amount of change in the reference voltage which makes a transition to a new value is greater than or equal to a predetermined value, the switch is turned off before the reference voltage starts to make a transition to a new value and is then held in its off state until the reference voltage becomes stable, and a third operational mode in which after the capacitor has become charged with the input voltage and then the input voltage is disconnected from the capacitor, the switch is held in its on state even though the reference voltage makes a transition to a new value. Thus the embodiment offers an advantage of being able to improve the AD conversion accuracy, and speed up the AD conversion as well. Furthermore, the embodiment offers an advantage of being able to provide an AD converter which can fit the needs of the user.

In accordance with another preferred embodiment of the present invention, there are provided a first operational mode in which every time the reference voltage from the DA converting unit makes a transition to a new value, the switch is turned off before the reference voltage starts to make a transition to a new value and is then held in its off state until the reference voltage becomes stable, a second operational mode in which only if the amount of change in the reference voltage which makes a transition to a new value is greater than or equal to a predetermined value, the switch is turned off before the reference voltage starts to make a transition to a new value and is then held in its off state until the reference voltage becomes stable, a third operational mode in which unless a number of times that the reference voltage has made a transition to a new value exceeds a predetermined number of times, the switch is turned off before the reference voltage starts to make a transition to a new value and the switch is then held in its off state until the reference voltage becomes stable, and a fourth operational mode in which after the capacitor has become charged with the input voltage and then the input voltage is disconnected from the capacitor, the switch is held in its on state even though the reference voltage makes a transition to a new value. Thus the embodiment offers an advantage of being able to improve the AD conversion accuracy, and speed up the AD conversion as well. Furthermore, the embodiment offers an advantage of being able to provide an AD converter which can fit the needs of the user.

In accordance with the present invention, there is provided a method of controlling an analog-to-digital converter which analog-to-digital converts an input voltage into a digital data, comprising the steps of: charging a first capacitor with the input voltage to be converted into a digital data; charging a second capacitor with a basic voltage; disconnecting the input voltage from the first capacitor; disconnecting the basic voltage from the second capacitor; in order to obtain highmost bits of the digital data, applying a reference voltage into which a digital data furnished by a control circuit is converted by a digital-to-analog (DA) converting unit to the first capacitor, by turning on a switch connected between the DA converting unit and the first capacitor, and applying a constant voltage furnished by the DA converting unit to the second capacitor, by turning on another switch connected between the DA converting unit and the second capacitor, so as to determine a new digital data to be furnished by the control circuit according to charged voltages on the first and second capacitors, so that the DA converting unit causes the reference voltage to be delivered to the first capacitor to make a transition to a new value according to the new digital data from the control circuit; before the reference voltage starts to make a transition to a new value, optionally turning off the first switch and then holding the first switch in its off state until the reference voltage from the DA converting unit becomes stable; in order to obtain the remaining lowermost bits of the digital data, constantly applying a voltage generated by the DA converting unit and having a value which is the same as that of a binary data comprised of the highmost bits determined by the above step and the lowermost bits of 0s to the first capacitor, by turning on the switch, and applying a second reference voltage generated by the DA converting unit from a digital data from the control circuit to the second capacitor, by turning on the other switch, so as to determine a new digital data to be furnished by the control circuit according to charged voltages on the first and second capacitors, so that the DA converting unit causes the second reference voltage to be delivered to the second capacitor to make a transition to a new value according to the new digital data from the control circuit; and before the second reference voltage makes a transition to a new value, optionally turning off the other switch and then holding the other switch in its off state until the second reference voltage from the DA converting unit becomes stable. Accordingly, the unstable reference voltage in transition cannot be applied to either the first capacitor or the second capacitor, and therefore the capacitance-coupled AD converter is immune to the unstable reference voltage making a transition to a new value. The embodiment offers an advantage of providing an AD converter controlling method with a high degree of conversion accuracy which is also applicable to a capacitance-coupled AD converter.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of controlling an analog-to-digital (A/D) converter for converting an input voltage into digital data, comprising:

charging a capacitor with an input voltage to be converted into digital data;

disconnecting the input voltage from the capacitor;

generating a reference voltage to be compared to the input voltage, wherein generating the reference includes applying digital control data from a control circuit to a digital-to-analog (D/A) converting unit;

applying the reference voltage to the capacitor, wherein applying the reference voltage to the capacitor includes turning on a switch connected between the D/A converting unit and the capacitor;

determining new digital control data to be furnished by the control circuit according to a relationship between the input voltage and the reference voltage applied to the capacitor;

supplying the new digital control data to the D/A converting unit to change the reference voltage to a new value; and before the reference voltage begins a transition to the new value, turning the switch off and then keeping the switch off until the reference voltage from the D/A converting unit becomes stable at the new value.

2. The method according to claim 1, wherein turning the switch off and keeping the switch off includes, every time the reference voltage from the D/A converting unit changes to a new value, turning off the switch before the reference voltage begins a transition to a new value and then keeping the switch off until the reference voltage becomes stable.

3. The method according to claim 1, wherein turning the switch off and keeping the switch off includes, only when selected transitions of the reference voltage from the D/A converting unit to a new value occur, turning off the switch before the reference voltage begins a transition to a new value and then keeping the switch off until the reference voltage becomes stable.

4. The method according to claim 3, wherein turning the switch off and keeping the switch off includes, only if a transition of the reference voltage is at least equal to a first value, turning off the switch before the reference voltage begins a transition to a new value and then holding the switch off state until the reference voltage becomes stable.

5. The method according to claim 3, comprising selecting a number of times the switch is turned off and kept off during a transition in the reference voltage, wherein turning the switch off and keeping the switch off comprises, when a number of times that the reference voltage changes to a new value does not exceed the selected number of times that the switch is turned off and kept off, turning the switch off before the reference voltage begins a transition to a new value, and keeping the switch off until the reference voltage becomes stable.

6. The method according to claim 3, comprising selecting whether to keep the switch off during each transition in the reference voltage, wherein turning the switch off and keeping the switch off comprises, only when selected transitions of the reference voltage to a new value occur, turning the switch off before the reference voltage begins a transition to a new value and keeping the switch off until the reference voltage becomes stable.

7. The method according to claim 1, comprising providing a plurality of operational modes for defining operations of the switch, selecting an operational mode from among the plurality of operational modes, and determining whether to turn the switch off before the reference voltage begins a transition to a new value and keeping the switch off until the reference voltage becomes stable, according to the operational mode selected.

8. The method according to claim 7, wherein providing a plurality of operational modes includes providing a first operational mode wherein, every time the reference voltage from the D/A converting unit changes to a new value, the switch is turned off before the reference voltage begins a transition to a new value and the switch is kept off until the reference voltage becomes stable, and a second operational mode wherein, after the capacitor is charged with the input voltage and the input voltage is disconnected from the capacitor, the switch is kept on when the reference voltage changes to a new value.

9. The method according to claim 7, wherein providing a plurality of operational modes includes providing a first operational mode wherein, only when the transition of the reference voltage is at least equal to a first value, the switch is turned off before the reference voltage begins a transition to a new value, and the switch is kept off until the reference voltage becomes stable, and a second operational mode wherein, after the capacitor is charged with the input voltage and the input voltage is disconnected from the capacitor, the switch is kept on when the reference voltage makes a transition to a new value.

10. The method according to claim 7, wherein providing a plurality of operational modes comprises providing a first operational mode wherein, unless a number of transitions that the reference voltage has made to a new value exceeds a first number, the switch is turned off before the reference voltage begins a transition to a new value and the switch is kept off until the reference voltage becomes stable, and a second operational mode, wherein, after the capacitor is charged with the input voltage and the input voltage is disconnected from the capacitor, the switch is kept on when the reference voltage changes to a new value.

11. The method according to claim 7, wherein providing a plurality of operational modes comprises providing a first operational mode wherein, every time the reference voltage from the D/A converting unit changes to a new value, the switch is turned off before the reference voltage begins a transition to a new value and the switch is kept off until the reference voltage becomes stable, a second operational mode wherein, only when a transition in the reference voltage is at least equal to a first voltage, the switch is turned off before the reference voltage begins a transition to the new value and the switch is kept off until the reference voltage becomes stable, and a third operational mode wherein after the capacitor is charged with the input voltage and the input voltage is disconnected from the capacitor, the switch is kept on when the reference voltage changes.

12. The method according to claim 7, wherein providing a plurality of operational modes comprises providing a first operational mode wherein, every time the reference voltage from the D/A converting unit changes to a new value, the switch is turned off before the reference voltage begins a transition to a new value and the switch is kept off state until the reference voltage becomes stable, a second operational mode wherein, only when a transition in the reference voltage is at least or equal to a first value, the switch is turned off before the reference voltage begins a transition to a new value and the switch is kept off until the reference voltage becomes stable, a third operational mode wherein the switch is turned off before the reference voltage begins a transition to a new value and the switch is kept off until the reference voltage becomes stable, unless a number of times that the reference voltage changes to a new value exceeds a first number of times, and a fourth operational mode wherein, after the capacitor is charged with the input voltage and the input voltage is disconnected from the capacitor, the switch is kept on when the reference voltage changes to a new value.

13. A method of controlling an analog-to-digital converter for converting an input voltage into digital data, comprising:

charging a first capacitor with an input voltage to be converted into digital data;

charging a second capacitor with a basic voltage;

disconnecting the input voltage from the first capacitor;

disconnecting the basic voltage from the second capacitor;

obtaining uppermost bits of the digital data, including:
  generating a first reference voltage to be compared to the input voltage, wherein generating the first reference voltage includes supplying first digital control data from a control circuit to a digital-to-analog (D/A) converting unit;
  applying the first reference voltage to the first capacitor, wherein applying the first reference voltage to the first capacitor includes turning on a first switch connected between the D/A converting unit and the first capacitor;
  applying a first constant voltage furnished by the D/A converting unit to the second capacitor, wherein applying the first constant voltage to the second capacitor includes turning on a second switch connected between the D/A converting unit and the second capacitor;

determining new digital control data to be furnished by the control circuit according to relationship between voltages applied to the first and second capacitor;

supplying the new digital control data from the control circuit to the D/A converting unit to change the first reference voltage to a new value; and before the first reference voltage begins a transition to a new value, turning off the first switch and keeping the first switch off until the first reference voltage from the D/A converting unit becomes stable; and obtaining remaining lowermost bits of the digital data including:

applying a second constant voltage generated by the D/A converting unit, the second constant voltage having a value corresponding to binary data of the uppermost bits and zeros for the lowermost bits, to the first capacitor, wherein applying the second constant voltage includes turning on the first switch;

applying a second reference voltage generated by the D/A converting unit from digital control data from the control circuit to the second capacitor, wherein applying the second reference voltage to the second capacitor includes turning the second switch on;

determining second new digital control data to be furnished by the control circuit according to a relationship between voltages applied to the first and second capacitors;

applying the second new digital control data from the control circuit to the D/A converting unit to change the second reference voltage to a new value; and before the second reference voltage changes to a new value, turning off the second switch and keeping the second switch off until the second reference voltage from the D/A converting unit becomes stable.

\* \* \* \* \*